United States Patent [19]

Terashima

[11] Patent Number: 5,477,064
[45] Date of Patent: Dec. 19, 1995

[54] THYRISTOR

[75] Inventor: Tomohide Terashima, Fukuoka, Japan

[73] Assignee: Mitsubishi Denki Kabushiki Kaisha, Tokyo, Japan

[21] Appl. No.: 977,169

[22] Filed: Nov. 16, 1992

[30] Foreign Application Priority Data

Dec. 20, 1991 [JP] Japan ................. 3-338205

[51] Int. Cl.6 .................. H01L 29/74; H01L 29/747; H01L 29/06
[52] U.S. Cl. .................. 257/133; 257/110; 257/155; 257/175; 257/120; 257/132; 257/149
[58] Field of Search ................. 257/110, 119, 257/120, 121, 132, 133, 143, 144, 145, 149, 152, 153, 155, 175, 176, 137, 151, 167

[56] References Cited

U.S. PATENT DOCUMENTS

| 4,782,379 | 11/1988 | Baliga | 257/155 |
| 4,961,099 | 10/1990 | Roggwiller | 257/149 |
| 5,202,750 | 4/1993 | Gough | 257/110 |

FOREIGN PATENT DOCUMENTS

| 0454201 | 10/1991 | European Pat. Off. . |
| 3733100 | 4/1988 | Germany . |
| 2-54968 | 2/1990 | Japan . |

Primary Examiner—Jerome Jackson
Assistant Examiner—Alice W. Tang
Attorney, Agent, or Firm—Oblon, Spivak, McClelland, Maier, & Neustadt

[57] ABSTRACT

An object of the present invention is to provide a semiconductor device which is designed so as to increase a maximum controllable current and decrease hold current without degrading its characteristic and to provide a method of manufacturing such a semiconductor device. A transistor formation region 3 and a P diffusion region 15 are selectively formed through an insulating film 4 between gate electrodes 5 on an $N^-$ epitaxial layer 2. In a transistor formation region 3, an $N^+$ diffusion region 12 is formed on a P diffusion region 11, a P diffusion region 13 is formed on the $N^+$ diffusion region 12, and an $N^+$ diffusion region 14 is selectively formed on a surface of the P diffusion region 13. Then, a cathode electrode 7 is formed on the P diffusion region 13, $N^+$ diffusion region 14 and P diffusion region 15, and an anode electrode 8 is formed on a second major surface of the $P^+$ substrate 1. Due to a structural characteristic that an increase in current between electrodes 7 and 8 causes no latch-up phenomenon, etc., a maximum controllable current can be increased, and hold current can be decreased.

15 Claims, 18 Drawing Sheets

THYRISTOR

BACKGROUND OF THE INVENTION

1. Field of the Invention

The present invention relates to a semiconductor device which operates by applying voltage to a control electrode such as an EST (Emitter Switched Thyristor) or the like.

2. Description of the Background Art

FIG. 18 is a sectional view showing a configuration of a conventional EST. As shown in FIG. 18, an $N^-$ epitaxial layer 52 is formed on a first major surface of a $P^+$ substrate 51, a P diffusion region 53 is formed on a surface of the $N^-$ epitaxial layer 52, $N^+$ diffusion regions 54a, 54b and 54c are selectively formed in a surface of the P diffusion region 53.

Then, a gate electrode 55a is formed through an insulating film 56 on the P diffusion region 53 between the $N^-$ epitaxial layer 52 and the $N^+$ diffusion region 54a, while a gate electrode 55b is formed through the insulating film 56 on the P diffusion region 53 between diffusion regions 54b and 54c. The gate electrodes 55a and 55b are formed of polysilicon. A cathode electrode 57 formed of aluminum silicon is formed directly on the P diffusion region 53 which is located between the $N^+$ diffusion regions 54a and 54b. The cathode electrode 57 is formed on the $N^+$ diffusion regions 54a and 54b as well. An anode electrode 58 of metal is directly formed on a second major surface of the $P^+$ substrate 51.

FIG. 19 is a model sectional view for explaining an operation of the EST shown in FIG. 18. The operation of the EST will be described with reference to FIG. 19.

When the cathode electrode 57 and the gate electrode 55 (electrodes 55a and 55b) are set at the same potential and a potential at the anode electrode 58 is raised, a depletion layer expands from a PN junction between the P diffusion region 53 and the $N^-$ epitaxial layer 52 to retain voltage.

When voltage at the gate electrode 55 is raised relative to the cathode electrode 57 in this state, surface regions 53a and 53b of the P diffusion region 53 just under the gate electrodes 55a and 55b are negatively inverted. As a result, as shown by allow with broken line, electrons flow from the $N^+$ diffusion region 54a to the $N^-$ epitaxial layer 52 while, as shown by allow with solid line, holes are introduced from the $P^+$ substrate 51 through the $N^-$ epitaxial layer 52 to the P diffusion region 53.

In all the holes flowing into the P diffusion region 53, part of the holes flowing into the P diffusion region 53 just below the $N^+$ diffusion regions 54b and 54c flow in lateral directions within the P diffusion region 53 as shown by the solid line arrow and reach the cathode electrode 57. At this time, a resistance R1 which the P diffusion region 53 just below the $N^+$ diffusion region 54c serves as causes a potential at the P diffusion region 53 just below the $N^+$ diffusion region 54c to rise relative to the cathode electrode 57. On the other hand, the $N^+$ diffusion region 54c is electrically connected through the $N^+$ diffusion region 54b and the negatively inverted P diffusion region 53b to the cathode electrode 57, and therefore, potential rising at the $N^+$ diffusion region 54c is considerable smaller compared with the cathode electrode 57.

Thus, as the holes flowing in the P diffusion regions 53 increase, a region between the $N^+$ diffusion region 54c and the P diffusion region 53 is forwardly biased, and electrons are gradually introduced through the P diffusion region 53 into the $N^-$ epitaxial layer 52. As a result, a thyristor comprised of the $N^+$ diffusion region 54c, P diffusion region 53, $N^-$ epitaxial layer 52 and $P^+$ substrate 1 turns ON to perform a thyristor operation. The thyristor operation enables an ON-state resistance value to be sufficiently low under an ON state of the EST. The resistance R1 is set to a sufficiently large value so that the thyristor operation may work.

Then, when voltage at the gate electrode 55 related to the cathode electrode 57 is reduced, a state of negative inversion of the P diffusion regions 53a and 53b is extinguished, and therefore, the holes introduced into the $N^-$ epitaxial layer 52 are cancelled because of a recombination within the $N^-$ epitaxial layer 52 and an introduction into the P diffusion region 53, and the thyristor turns OFF.

Although a resistance value of a resistance R2 of the P diffusion region 53 below the $N^+$ diffusion region 53b is set sufficiently low, potential rising because of the resistance R2 causes a region between the $N^+$ diffusion region 54b and the P diffusion region 53 to be forwardly biased when hole current introduced into the P diffusion region 53 in ON state, and a parasitic thyristor comprised of the $N^+$ diffusion region 54b, P diffusion region 53, $N^-$ epitaxial layer 52 and $P^+$ substrate 51 turns ON to perform a thyristor operation. Once the parasitic thyristor starts its operation, it is in a latch-up state where the gate electrode 55 is useless to turn off current flowing between the electrodes 57 and 58.

FIG. 20 is a circuit diagram showing an equivalent circuit of the EST shown in FIGS. 18 and 19. Referring to FIG. 20, the EST circuit includes an NPN bipolar transistor T1 consisting of the $N^+$ diffusion region 54c, P diffusion region 53 and $N^-$ epitaxial layer 52, a PNP bipolar transistor T2 consisting of the $P^+$ substrate 51, $N^-$ epitaxial layer 52 and P diffusion region 53, and an NPN bipolar transistor T3 consisting of the $N^+$ diffusion region 54b, P diffusion region 53 and $N^-$ epitaxial layer 52. It also includes an NMOS transistor Q1 consisting of the $N^+$ diffusion region 54a, P diffusion region 53a, $N^-$ epitaxial layer 52 and gate electrode 55a, and an NMOS transistor Q2 consisting of the $N^+$ diffusion region 54b, P diffusion region 53b, $N^+$ diffusion region 54c and gate electrode 55b.

The NMOS transistors Q1 and Q2 are transistors for turning ON or OFF the EST. The transistor Q2 is connected in series to a thyristor consisting of the bipolar transistors T1 and T2, and the thyristor turns ON in accordance with turning ON of the transistor Q1. The bipolar transistor T3 is a parasitic transistor of which base and emitter are short circuited by the resistance R2 so as not to be activated, but when current flowing in the resistance R2 becomes too large, a parasitic thyristor consisting of the bipolar transistors T2 and T3 is activated and latches up.

FIG. 21 is a graph showing a flow rate of the current I flowing between the electrodes 57 and 58 (referred to as "conducting current" hereinafter) related to voltage V at the gate electrode 55 (referred to as "control voltage" hereinafter) related to the cathode electrode 57. However, the conducting current I is logarithmically indicated. As shown in FIG. 21, when the conducting current I reaches a flow rate I1, it is in a latch-up state which is uncontrollable by the control voltage V.

The conventional EST is configured as mentioned above, and it has the disadvantage that increasing the conducting current I causes latch-up and the control voltage V cannot control the conducting current I. A latch-up phenomenon gives a restriction of a maximum controllable current or a maximum flow rate of the conducting current I which can be controlled by the control voltage V.

In order to gain a larger maximum controllable current, a concentration of the P diffusion region 53 under the N⁺ diffusion region 54b may be increased while a resistance value of the resistance R2 may be decreased to suppress the latch-up phenomenon. However, the resistance value of the resistance R2 cannot be limitlessly decreased because, unnecessarily increasing the concentration of the P diffusion region 53 under the N⁺ diffusion region 54b affects threshold voltage VTH of the NMOS transistor Q2 having source and drain regions of the N⁺ diffusion regions 54b and 54c. Thus, there arises the problem that the maximum controllable current cannot be sufficiently increased.

Also, in order to decrease hold current IK (see FIG. 21) which is a minimum current required for retaining the thyristor operation, the P diffusion region 53 and the N⁺ diffusion region 54c may be formed so that the P diffusion region 53 just below the N⁺ diffusion region 54c may be sufficiently long in order to increase the resistance value of the resistance R1, however, in such a way, a channel width of the NMOS transistor Q2 per unit area becomes small, so that the ON-state resistance during the thyrister operation becomes large, and there is a restriction in raising a resistance value of the resistance R1. Thus, there is the problem that the hold current cannot be sufficiently decreased.

SUMMARY OF THE INVENTION

According to the present invention, a semiconductor device includes a semiconductor substrate of a first conductivity type having a first and second major surfaces; a first semiconductor layer of a second conductivity type formed on the first major surface of the first semiconductor substrate; a first semiconductor region of the first conductivity type selectively formed on the first semiconductor layer; a second semiconductor region of the second conductivity type formed on the first semiconductor region; a third semiconductor region of the first conductivity type formed on the second semiconductor region; a fourth semiconductor region selectively formed in a surface of the third semiconductor region; a first insulating film formed on a side surface of the first semiconductor region between the first semiconductor layer and the second semiconductor region; a first control electrode formed on the first insulating film; a second insulating film formed on a side surface of the third semiconductor region between the second semiconductor region and the fourth semiconductor region; a second control electrode formed on the second insulating film; a first main electrode formed on the third and fourth semiconductor regions independent of the first and second control electrodes; and a second main electrode formed on a second major surface of the semiconductor substrate.

Preferably, the semiconductor device further includes a fifth semiconductor region of the first conductivity type selectively formed on the first semiconductor layer independent of the first, second, third and fourth semiconductor regions and the first and second control electrodes; the first main electrode being also formed on the fifth semiconductor region.

Preferably the semiconductor device further includes a fifth semiconductor region of the first conductivity type formed on the first semiconductor layer contiguous to the first and third semiconductor regions and independent of the first and second control electrodes; the first main electrode being also formed on the fifth semiconductor region.

Preferably, the first and second insulating films are integrally formed while the first and second control electrodes are formed as a unity.

Preferably, the first conductivity type is a P type while the second conductivity type is an N type.

In another aspect of the present invention, a semiconductor device includes a first semiconductor layer of a second conductivity type having first and second major surfaces; a first semiconductor region of a first conductivity type selectively formed on the first semiconductor layer; a second semiconductor region of the second conductivity type formed on the first semiconductor region; a third semiconductor region of the first conductivity type formed on the second semiconductor region; a fourth semiconductor region selectively formed in a surface of the third semiconductor region; a fifth semiconductor region of the first conductivity type selectively formed on a second major surface of the first semiconductor layer; a first insulating film formed on a side surface of the first semiconductor region between the first semiconductor layer and the second semiconductor region; a first control electrode formed on the first insulating film; a second insulating film formed on a side surface of the third semiconductor region between the second semiconductor region and the fourth semiconductor region; a second control electrode formed on the second insulating film; a first main electrode formed on the third and fourth semiconductor regions independent of the first and second control electrodes; and a second main electrode formed on a second major surface of the first semiconductor layer including the fifth semiconductor region.

In still another aspect of the present invention, a semiconductor device includes a semiconductor substrate of a first conductivity type having first and second major surfaces; a semiconductor buffer layer of a second conductivity type formed on the first major surface of the semiconductor substrate; a first semiconductor layer of the second conductivity type formed on the semiconductor buffer layer, the first semiconductor layer being lower in impurity concentration than the semiconductor buffer layer; a first semiconductor region of the first conductivity type selectively formed on the first semiconductor layer; a second semiconductor region of the second conductivity type formed on the first semiconductor region; a third semiconductor region of the first conductivity type formed on the second semiconductor region; a fourth semiconductor region selectively formed in a surface of the third semiconductor region; a sixth semiconductor region of the second conductivity type selectively formed on a second major surface of the semiconductor substrate; a first insulating film formed on a side surface of the first semiconductor region between the first semiconductor layer and the second semiconductor region; a first control electrode formed on the first insulating film; a second insulating film formed on a side surface of the third semiconductor region between the second semiconductor region and the fourth emiconductor region; a second control electrode formed on the second insulating film; a first main electrode formed on the third and fourth semiconductor regions independent of the first and second control electrodes; and a second main electrode formed on a second major surface of the first semiconductor substrate including the sixth semiconductor region.

The present invention is also directed to a method of manufacturing a semiconductor device which includes the steps of preparing a semiconductor substrate of a first conductivity type having first and second major surfaces; forming a first semiconductor layer of a second conductivsecond semiconductor layer of the first conductivity type on the first semiconductor layer; selectively forming a second semiconductor region of the second conductivity type in a surface of the second semiconductor layer for defining a portion of the second semiconductor layer under the second semiconductor region as a first semiconductor region; selectively forming a third semiconductor region of the first conductivity type in a surface of the second semiconductor region; selectively forming a fourth semiconductor region on a surface of the third semiconductor region; selectively forming a groove extending from the surface of the second semiconductor layer to the surface of the first semiconductor layer to separate a semiconductor element region composed of at least the first semiconductor region, the second semiconductor region, the third semiconductor region and the fourth semiconductor region; forming a first insulating film in inner walls of the groove contiguous to a side surface of the first semiconductor region; forming a second insulating film in the inner circumference of the groove contiguous to a side surface of the third semiconductor region; forming a first control electrode on the first insulating film; forming a second control electrode on the second insulating film; forming a first main electrode on the third and fourth semiconductor regions independent of the first and second control electrodes; and forming a second main electrode on a second major surface of the semiconductor substrate.

In another aspect of the present invention, a method of manufacturing a semiconductor device includes the steps of preparing a semiconductor substrate of a first conductivity type having first and second major surfaces; forming a first semiconductor layer of a second conductivity type on the first major surface of the first semiconductor substrate; forming a second semiconductor layer of the first conductivity type on the first semiconductor layer; selectivily forming a second semiconductor region of the second conductivity type in a surface of the second semiconductor layer for defining a portion of the second semiconductor layer under the second semiconductor region as a first semiconductor region; selectively forming a third semiconductor region of the first conductivity type in a surface of the second semiconductor region; selectively forming a fourth semiconductor region in a surface of the third semiconductor region; selectively forming a groove extending from the surface of the second semiconductor layer to a surface of the first semiconductor layer, the grooves isolating a semiconductor element forming region consisting of the first semiconductor region, the second semiconductor region, the third semiconductor region and the fourth semiconductor region from a fifth semiconductor region consisting of a remaining portion of the second semiconductor layer alone; forming a first insulating film contiguous to a side surface of the first semiconductor region in inner walls of the groove; forming a second insulating film contiguous to the third semiconductor region in the inner walls of the grooves; forming a first control electrode on the first insulating film; forming a second control electrode on the second insulating film; forming a first main electrode on the third, fourth and fifth semiconductor regions independent of the first and second control electrodes; and forming a second main electrode on the second major surface of the semiconductor substrate.

Preferably, the semiconductor element region includes as a sixth semiconductor region a portion of the second semiconductor layer which is contiguous to the first and third semiconductor regions and independent of the fourth semiconductor region.

Preferably, the first and second insulating films are simultaneously integrally formed and the first and second control electrodes are simultaneously formed as one.

Preferably, the first conductivity type is a P type while the second conductivity type is an N type.

In yet another aspect of the present invention, a method of manufacturing a semiconductor device includes the steps of preparing a first semiconductor layer of a second conductivity type having first and second major surfaces; forming a second semiconductor layer of a first conductivity type on the first major surface of the first semiconductor layer; selectively forming a second semiconductor region of the second conductivity type in a surface of the second semiconductor layer for defining a portion of the second semiconductor layer under the second semiconductor region as a first semiconductor region; selectively forming a third semiconductor region of the first conductivity type in a surface of the second semiconductor region; selectively forming a fourth semiconductor region in a surface of the third semiconductor region; selectively forming a groove from the surface of the second semiconductor layer which includes the first to fourth semiconductor regions to a surface of the first semiconductor layer; forming a first insulating film contiguous to a side surface of the first semiconductor region in inner walls of the groove; forming a second insulating film contiguous to a side surface of the third semiconductor region in the inner walls of the groove; forming a first control electrode on the first insulating film; forming a second control electrode on the second insulating film; forming a first main electrode on the third and fourth semiconductor regions independent of the first and second control electrodes; selectively forming a fifth semiconductor region of the first conductivity type in the second major surface of the first semiconductor layer; and forming a second main electrode on the second major surface of the first semiconductor layer including the fifth semiconductor region.

In further another aspect of the present invention, a method of manufacturing a semiconductor device includes the steps of preparing a semiconductor substrate of a first conductivity type having first and second major surfaces; forming a semiconductor buffer layer of a second conductivity type on the first major surface of the first semiconductor substrate; forming a first semiconductor layer of the second conductivity type on the semiconductor buffer layer, the first semiconductor layer being lower in impurity concentration than the semiconductor buffer layer; forming a second semiconductor layer of the first conductivity type on the first semiconductor layer; selectively forming a second semiconductor region of the second conductivity type in a surface of the second semiconductor layer for defining a portion of the second semiconductor layer under the second semiconductor region as a first semiconductor region; selectively forming a third semiconductor region of the first conductivity type in a surface of the second semiconductor region; selectively forming a fourth semiconductor region in a surface of the third semiconductor region; selectively forming a groove from the surface of the second semiconductor layer including the first to fourth semiconductor regions to a surface of the first semiconductor layer; forming a first insulating film contiguous to the first semiconductor region in inner walls of the groove; forming a second insulating film contiguous to the third semiconductor region in the inner walls of the groove; forming a first control electrode on the first insulating film; forming a second control electrode on the second insulating film; forming a first main electrode on the third and fourth semiconductor regions independent of the first and second control electrodes; selectively forming a fifth semiconductor region of the second conductivity type in the second major surface of the semiconductor substrate; and forming a second main electrode on the second major surface of the semiconductor substrate including the fifth semiconductor region.

A semiconductor device as defined in the present invention or a device manufactured in a method as defined in the present invention has a configuration of a thyristor comprised of a semiconductor substrate, a first semiconductor layer, and first and second semiconductor regions.

The thyristor is turned on by setting the first and second control electrodes at a predetermined level of potential and inverting a conductivity of the side surface of each of the first and third semiconductor regions under the first and second insulating films into the second conductivity type.

Even if the thyristor turns on, carriers introduced from the first semiconductor region into the second semiconductor region recombine, and therefore, almost all the carriers can scarcely reach the third semiconductor region of the first conductivity type.

Thus, the carriers led in the third semiconductor region of the first conductivity type never cause a potential difference at a level where a region between the third semiconductor region and fourth semiconductor region has a forward bias, and hence, a parasitic transistor consisting of the second, third and fourth semiconductor regions is never activated.

Moreover, the side surface of the first semiconductor region is inverted to the second conductivity type, and this allows an amplification factor of the current in a transistor comprised of the first and second semiconductor regions to enhance.

Accordingly, it is an object of the present invention to provide a semiconductor device in which a maximum controllable current can be increased but a hold current can be decreased without degrading its characteristic and to provide a method of manufacturing the same.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
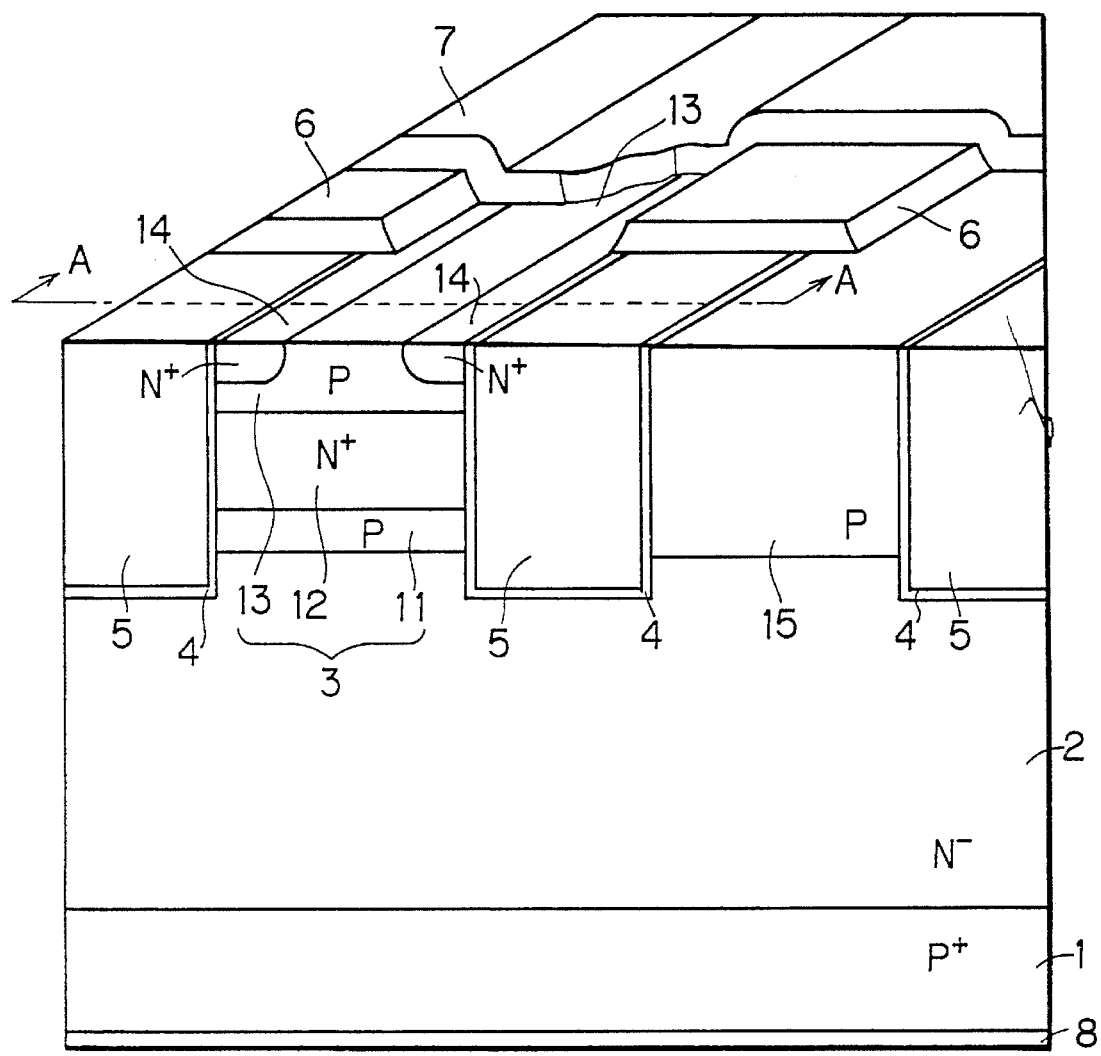
FIG. 1 is a perspective view showing a configuration of an EST of a first embodiment according to the present invention.
Figure 2:
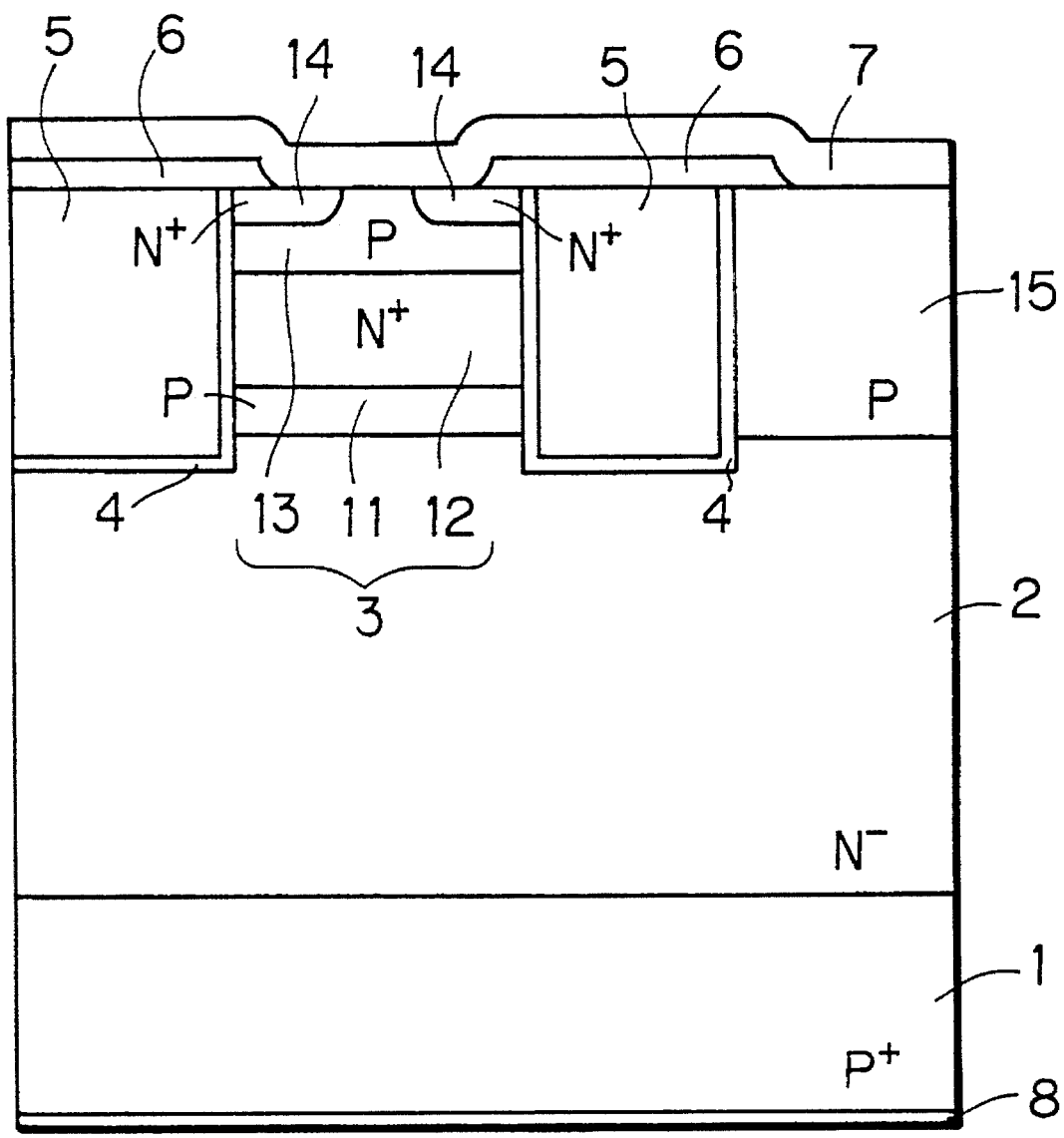
FIG. 2 is a sectional view taken along A—A of FIG. 1.

FIG. 1 is a perspective view showing a configuration of an EST of a first embodiment according to the present invention and FIG. 2 is a sectional view along A—A of FIG. 1. As shown in FIGS. 1 and 2, an N⁻ epitaxial layer 2 is formed on a first major surface of a P⁺ substrate 1. Then, a buried gate electrode 5 of polysilicon is selectively formed through an insulating film on a surface region of the N⁻ epitaxial layer 2.

On the N⁻ epitaxial layer 2 between two of gate electrodes 5, a transistor formation region 3 or P diffusion region 15 is selectively formed, either of which is insulated from the gate electrodes 5 because of the insulating film 4 intervening therebetween.

An N⁺ diffusion region 12 is formed on a P diffusion region 11 in the transistor formation region 3, a P diffusion region 13 is formed on an N⁺ diffusion region 12 therein, and an N⁺ diffusion region 14 is selectively formed in a surface of the P diffusion region 13.

Then, an insulating film 6 is formed over the entire surface of the gate electrodes 5, and a cathode electrode 7 of aluminum-silicon is formed on the P diffusion region 13, N⁺ diffusion region 14 and P diffusion region 15 where insulating film 6 is not formed. Furthermore, an anode electrode 8 of metal is formed on a second major surface of the P⁺ substrate 1.

Figure 3:
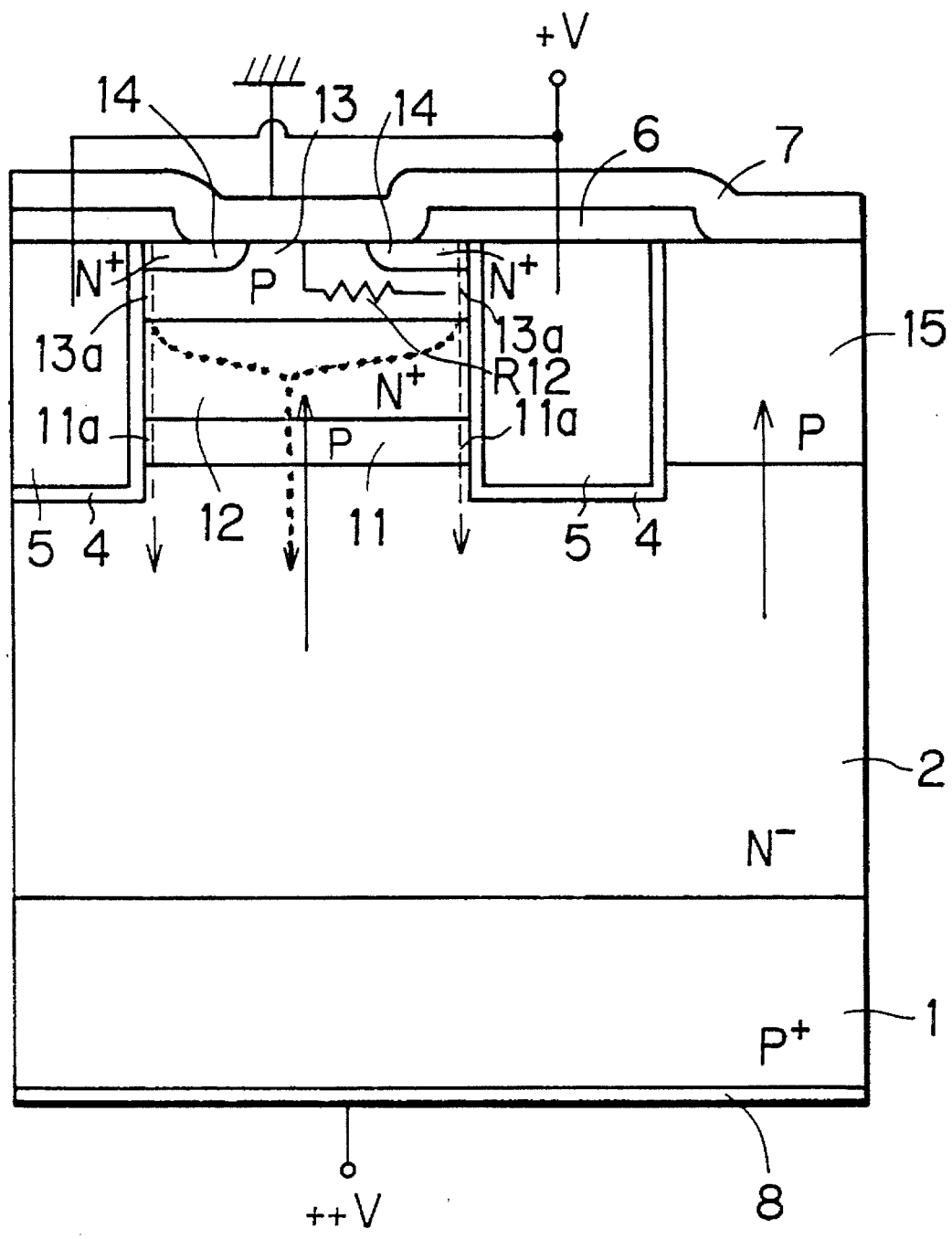
FIG. 3 is a model sectional view for explaining the operation of the EST of the first embodiment.

FIG. 3 is a model sectional view for explaining the operation of the EST shown in FIGS. 1 and 2. The operation of the EST will now be described with reference to FIG. 3.

When a potential of the anode electrode 8 is raised setting the cathode electrode 7 and the gate electrode 5 at the same potential, depletion layers expand from PN junctions between the P diffusion regions 11, 15 and the N⁻ epitaxial layer 2 to hold a voltage.

When voltage at the gate electrode 5 related to the cathode electrode 7 is raised, side regions 11a and 13a of the P diffusion region 11 and 13 which are opposed through the gate electrode 5 and insulating film 4 are negatively inverted. As a result, as shown by arrow of broken line, electrons from the cathode electrode 7 flow out to the epitaxial layer 2 while a junction between the P⁺ substrate 1 and N⁻ epitaxial layer 2 is forwardly biased, and holes are introduced from the P⁺ substrate 1 through the N⁻ epitaxial layer 2 to the P diffusion regions 11 and 15, as shown by arrow of solid line.

As the holes flowing in the P diffusion region 11 are introduced into the N⁺ diffusion region 12, electrons are introduced from the N⁺ diffusion region 12 to the P diffusion region 11, as shown by arrow of broken line. When current between the anode electrode 8 and cathode electrode increases, a thyristor consisting of the N⁺ diffusion region 12, P diffusion region 11, N⁻ epitaxial layer 2 and P⁺ substrate 1 turns on and starts operation.

In the above-mentioned configuration, the side region 11a of the P diffusion region 11 is negatively inverted, and therefore, a current amplification factor hFE of an NPN bipolar transistor consisting of the N⁺ diffusion region 12, P diffusion region 11 and N⁻ epitaxial layer 2 is enhanced. The P diffusion region 11 is in electrically floating state. These work all together to enable a minimum current (hold current) for retaining a thyristor operation to become smaller.

When the thyristor is operating, most holes introduced from the P diffusion region 11 into the N⁺ diffusion region 12 recombine within the N⁺ diffusion region 12, and hence, almost no current flows in a resistance R12 of the P diffusion region 12. Thus, no forward bias is applied between the N⁺ diffusion region 14 and P diffusion region 13, an NPN bipolar transistor consisting of the N⁺ diffusion region 14, P diffusion region 13 and N⁺ diffusion region 12 never turns on, and no latch-up state is constituted. Thus, a maximum controllable current can be increased.

Then, when voltage at the gate electrode 5 related to the cathode electrode 7 is lowered, a negative inversion at the P diffusion region 13a is extinguished, and consequently, the thyristor stops its operation, holes introduced from the P⁺ substrate 1 into the N⁻ epitaxial layer 2 recombine within the N⁻ epitaxial layer 2 and the holes disappear as they flow into the P diffusion region 15 to cause an OFF state. Otherwise, an extent of the falling of the voltage at the gate electrode 5 related to the cathode electrode is increased to positively invert the side region 12a of the N⁺ diffusion region 12, so that holes introduced into the N⁻ epitaxial layer 2 can be led from the P diffusion region 11 into the P diffusion region 13 to cause an OFF state.

Most of the holes introduced into the N⁻ epitaxial layer 2 flow into the P diffusion region 15 when an area of the P diffusion region 15 is too large, and therefore, a hold current for holding the thyristor operation is increased, but adequately forming the P diffusion region 15 allows a turn-off period to be shortened and the hold current to be minimized.

Figure 4:
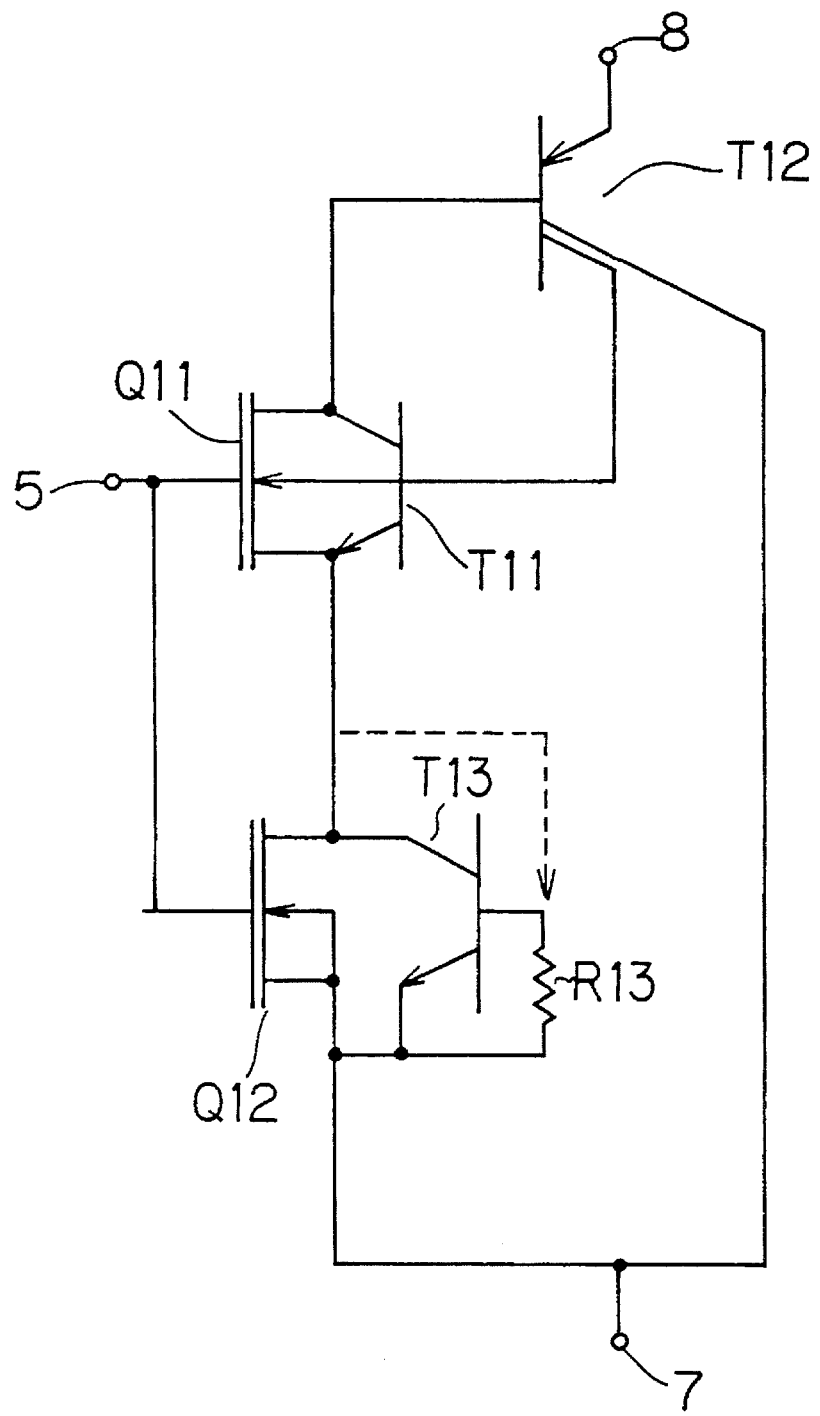
FIG. 4 is an equivalent circuit diagram of the EST of the first embodiment.

FIG. 4 is a circuit diagram showing an equivalent circuit of the EST of the first embodiment. In FIG. 4, the EST includes an NPN bipolar transistor T11 consisting of the N⁺ diffusion region 12, P diffusion region 11 and N⁻ epitaxial layer 2, a PNP bipolar transistor T12 consisting of the P⁺ substrate 1, N⁻ epitaxial layer 2 and P diffusion region 11, and an NPN Bipolar transistor T13 consisting of the N⁺ diffusion region 14, P diffusion region 13 and N⁺ diffusion region 12. The EST also includes an NMOS transistor Q11 consisting of the N⁺ diffusion region 12, P diffusion region 11, N⁻ epitaxial layer 2 and gate electrode 5, and an NMOS transistor Q12 consisting of the N⁺ diffusion region 12, P diffusion region 13, N⁺ diffusion region 14 and gate electrode 5.

Simultaneously turning on the NMOS transistors Q11 and Q12 causes a thyristor consisting of the bipolar transistors T11 and T12 to turn on, and on the other hand, turning off the NMOS transistor Q12 causes the thyristor to turn off.

A bipolar transistor T3 is a parasitic transistor, of which base and emitter are short-circuited by the resistance R12 within the P diffusion region 13, and since base current flowing in the resistance R12 never becomes larger for the previously mentioned reason, voltage large enough to forwardly bias the base and emitter is not developed. Thus, a parasitic thyristor consisting of bipolar transistors T11 to T13 never operate, and this means the EST of the first embodiment is never in a latch-up state.

FIGS. 5 to 11 are sectional views showing a method of manufacturing the EST of the first embodiment. Now, a process of manufacturing the EST of the first embodiment will be described with reference to these figures.

Figure 5:
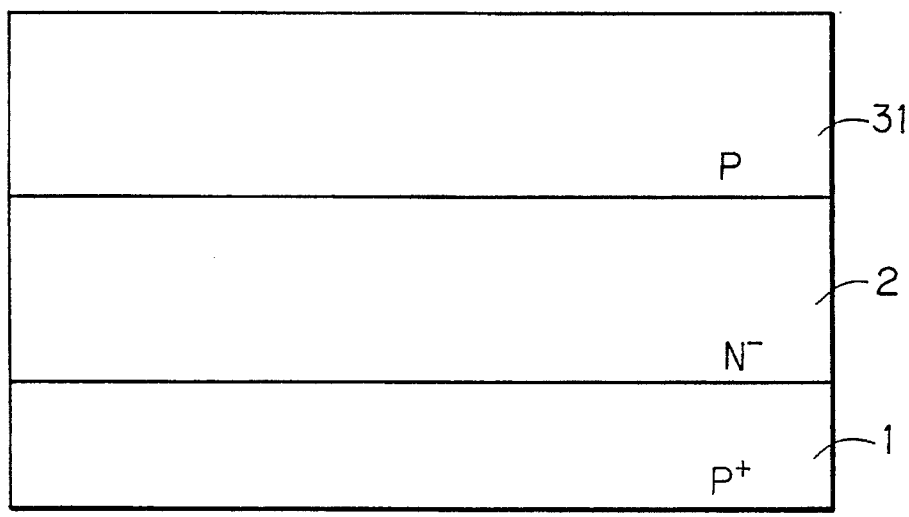
FIG. 5 is a sectional view showing a manufacturing method of the EST of the first embodiment.

First, as shown in FIG. 5, the N⁻ epitaxial layer 2 is formed on the P⁺ substrate 1 by an epitaxial growing method, and after a thermal oxidation film is formed on the N⁻ epitaxial layer 2, a P-type impurity is implanted with a mask of a regist and then annealed to form a P diffusion layer 31.

Figure 6:
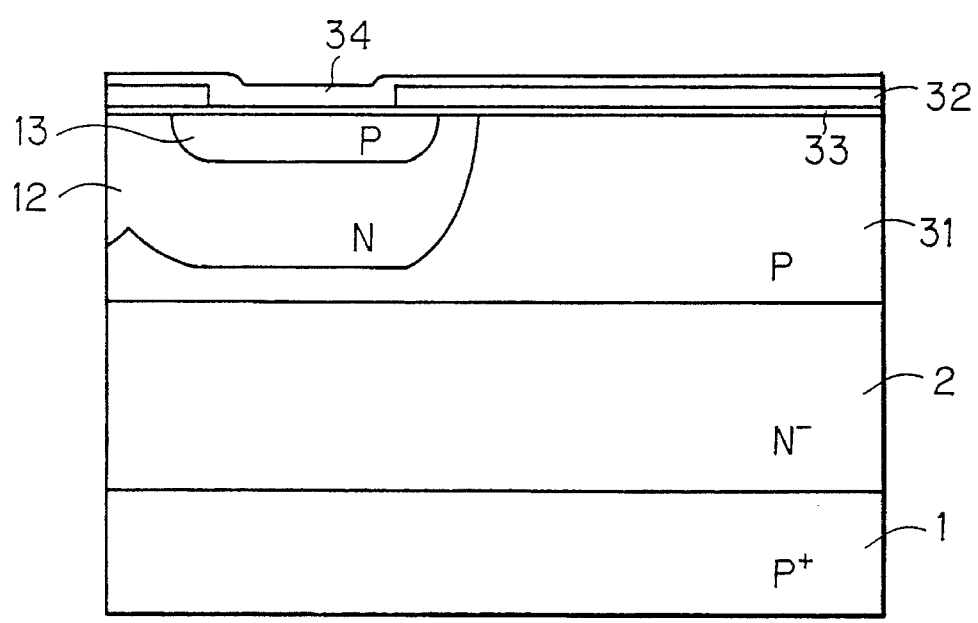
FIG. 6 is a sectional view showing a manufacturing method of the EST of the first embodiment.

Then, as shown in FIG. 6, after the thermal oxidation film is removed, a base oxidation film 33 is formed over the entire surface of the P diffusion layer 31, and thereafter, a nitride film 32 is formed on the base oxidation film 33. After that, the nitride film 32 are patterned to make a window for introducing impurities. An N-type impurity is implanted through the window and annealed to form the N⁺ diffusion region 12. At this time, an oxidation film not shown is simultaneously formed. The N-type impurity ion is implanted in high energy, because it is necessary that the N⁺ diffusion region 12 is deep in depth and has high impurity concentration. Then, after the oxidation film is etched away, a base oxidation film is formed again, a P-type impurity is implanted and annealed to form the P diffusion region 13. At this time, an oxidation film 34 is simultaneously formed.

Figure 7:
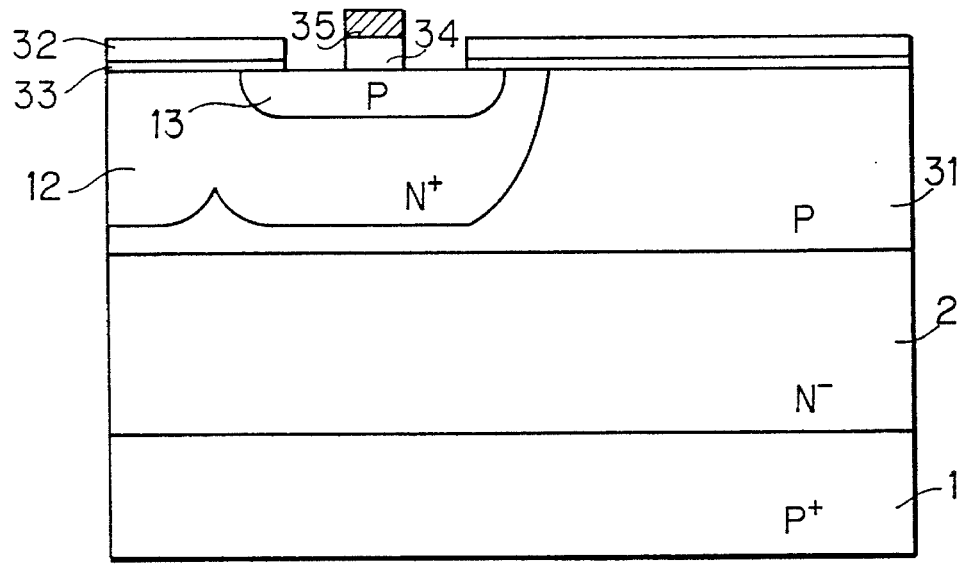
FIG. 7 is a sectional view showing a manufacturing method of the EST of the first embodiment.
Figure 8:
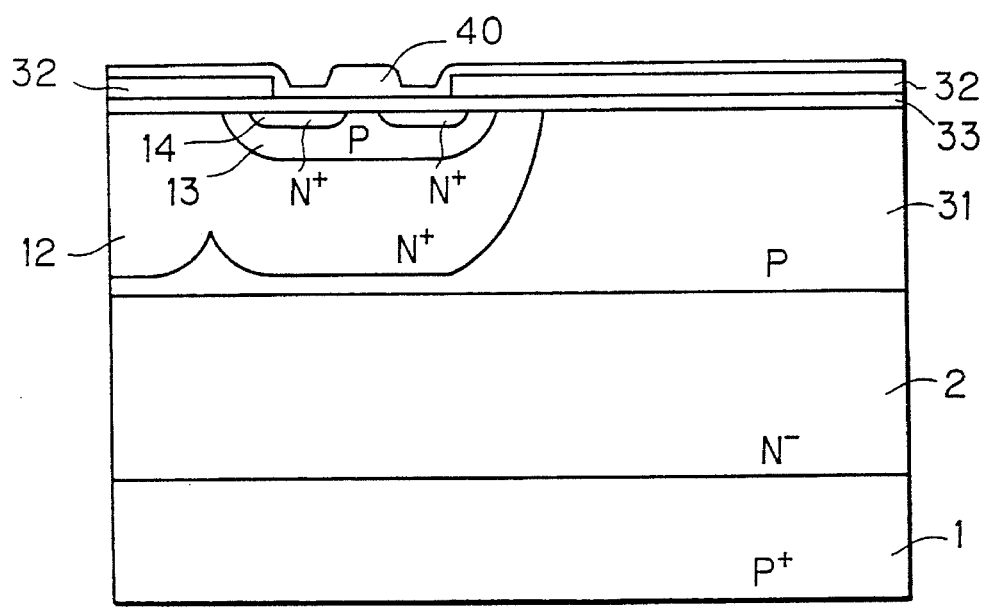
FIG. 8 is a sectional view showing a manufacturing method of the EST of the first embodiment.

Then, as shown in FIG. 7, the oxidation film 34 is coated with resist 35, and the resist 35 is patterned. Then, the oxidation film 34 is subjected to an etching process with a mask of the resist 35, and arsenic is introduced with a mask of the oxidation film 32 and annealed to form the N⁺ diffusion region 14 as shown in FIG. 8. At this time, an oxidation film 40 is simultaneously formed.

Figure 9:
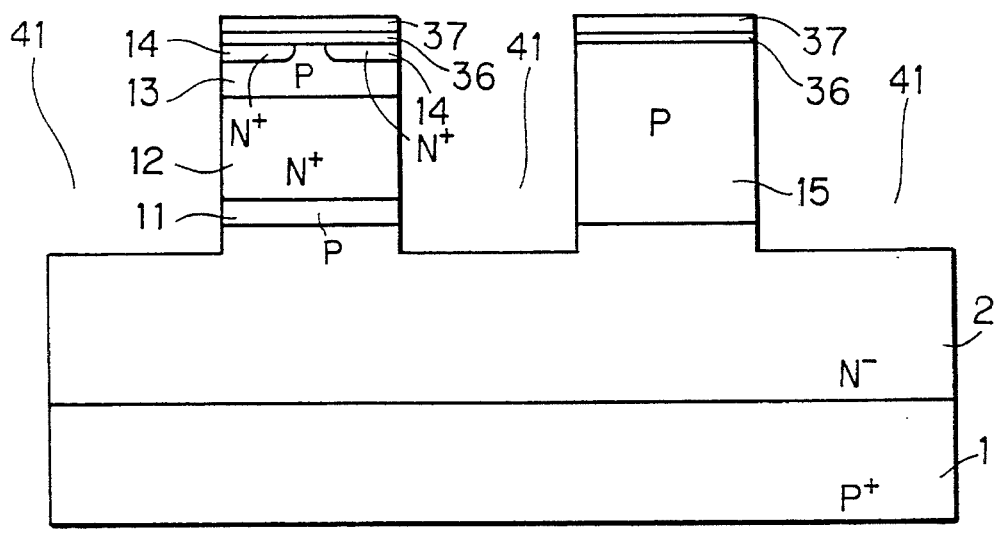
FIG. 9 is a sectional view showing a manufacturing method of the EST of the first embodiment.

Then, as shown in FIG. 9, oxidation films 33 and 40 and a nitride film 32 are removed, and a base oxidation film 36 and a nitride film 37 are formed over the entire surface. After that, the oxidation film 36 and nitride film 37 are patterned, and with a mask of the patterned oxidation film 36 and nitride film 37, grooves 41 are selectively formed by deeply etching extending over a surface of the N⁻ epitaxial layer 2. The etching may be a dry etching or other anisotropic etching. As a result, in the P diffusion layer 31 still remaining, a region having the N⁺ diffusion region 12 thereupon is defined as the P diffusion region 11 while a region having no region thereupon is defined as the P diffusion region 15.

Figure 10:
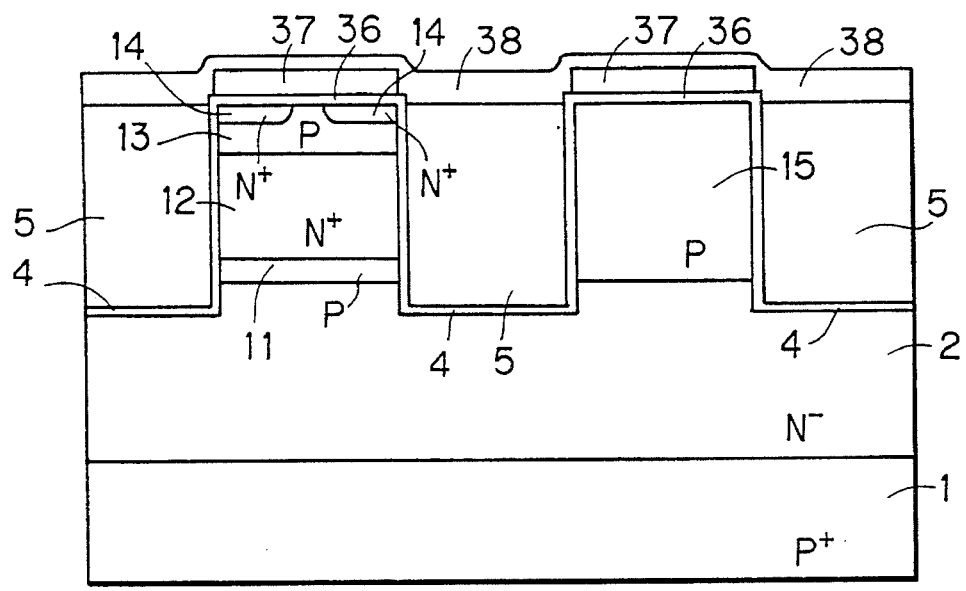
FIG. 10 is a sectional view showing a manufacturing method of the EST of the first embodiment.
Figure 11:
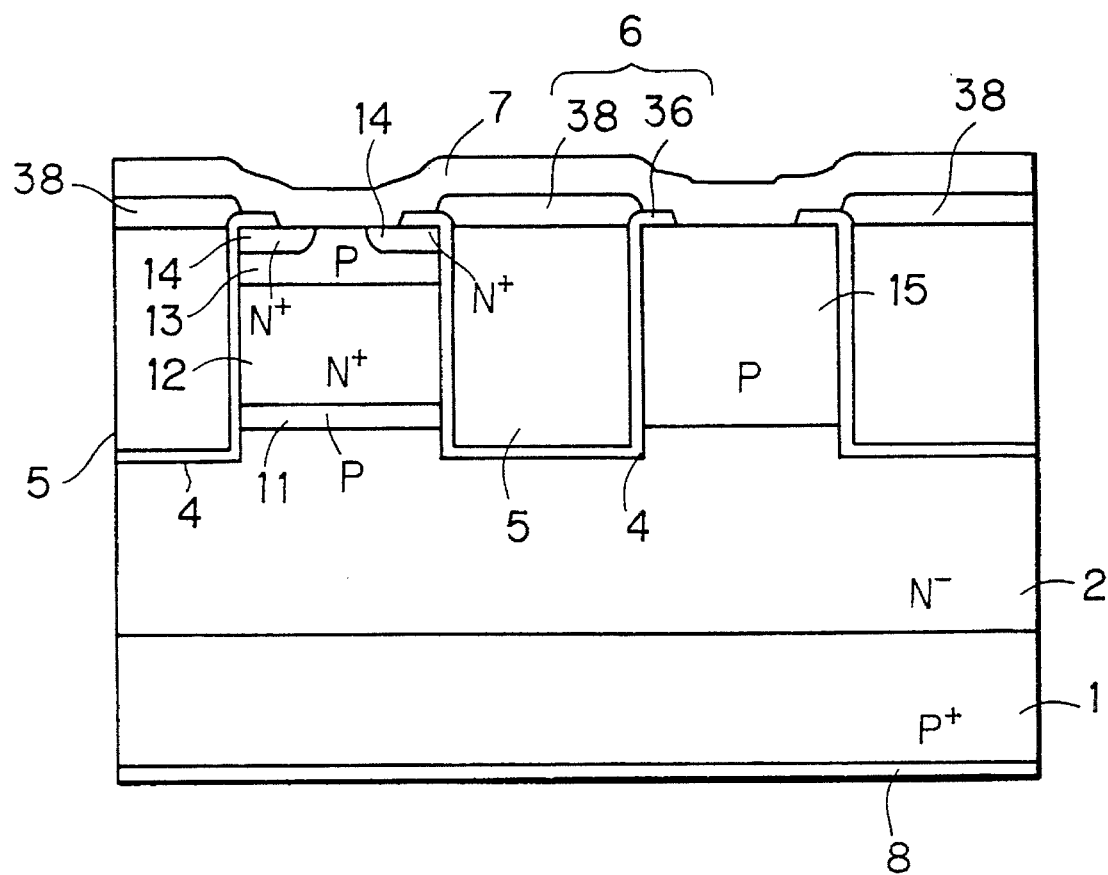
FIG. 11 is a sectional view showing a manufacturing method of the EST of the first embodiment.

Then, as shown in FIG. 10, after an oxidation film 4 is thinly formed in inner walls of the grooves 41, polysilicon is deposited over the entire surface including the inside of the grooves 41 and etched back till the polysilicon remains only in the inside of the grooves 41, so that the gate electrode 5 is formed. After that, an oxidation film is formed over the entire surface by a thermal oxidation method.

Utilizing a thinness of the oxidation film 38 on the nitride film 37, an oxidation film etching is performed to expose the nitride film 37 alone, and further, the nitride film 37 is removed by a nitride film etching. Then, as shown in FIG.

11, the oxidation films 36 and 38 are patterned until they remain covering the entire surface of the gate electrode 5. As a result, the remaining oxidation film 36 serves as the oxidation film 6 (see FIGS. 1 to 3). In patterning the oxidation films 36 and 38, a self-align process may be performed where taking advantage of thinness of each of the oxidation films 36 and 38, the oxidation films 36 and 38 entire are etched so that the oxidation film 38 alone may remain.

After that, aluminum-silicon is deposited by sputtering to form the cathode electrode 7. Then, by an evaporation of metal on a second major surface of the $P^+$ substrate 1, the anode electrode 8 is formed, and thus the EST of the first preferred embodiment can be manufactured.

Figure 12:
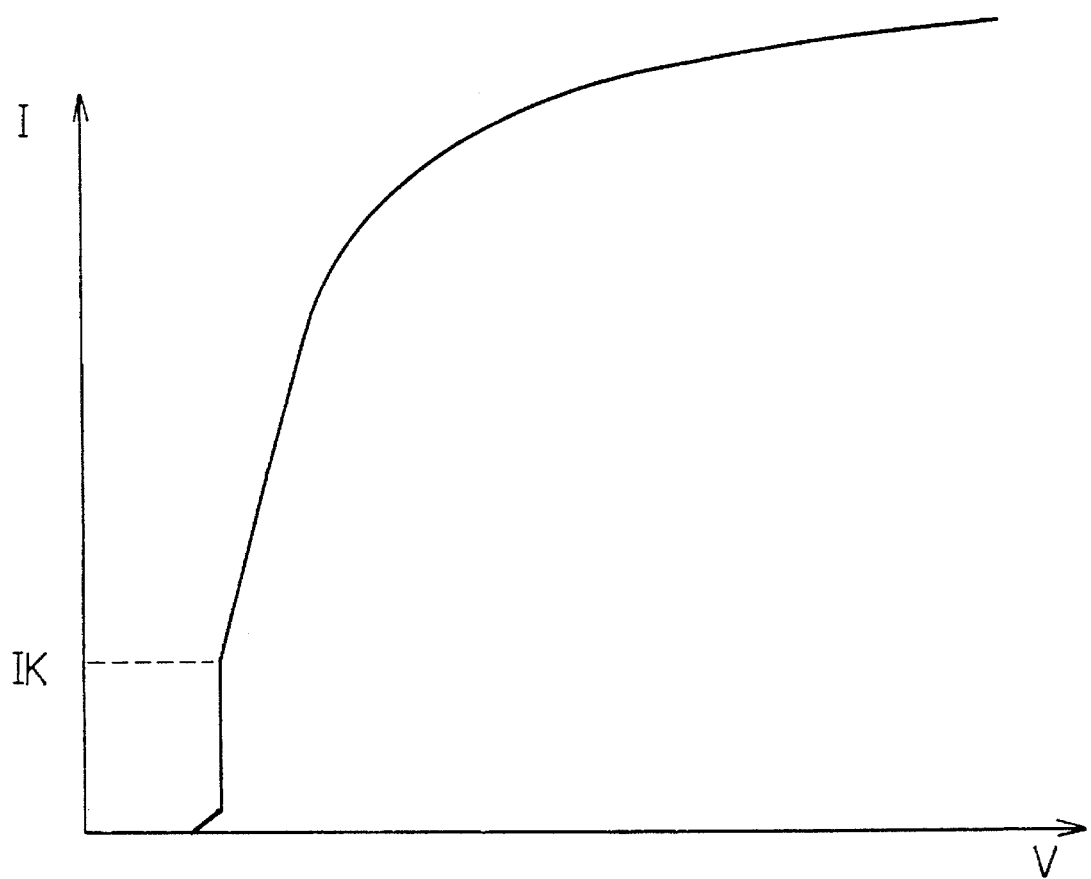
FIG. 12 is a graph showing a relation between control voltage and conducting current in the EST of the first embodiment.

FIG. 12 is a graph showing a flow rate of current I flowing between the electrodes 7 and 8 in relation with voltage V at the gate electrode 5 (referred to as "control electrode" hereinafter) related to the cathode electrode 7, however, the conducting current I is logarithmically expressed. As can be seen, even if hold current IK is repressed low while the conducting current I increases, a latch-up phenomenon never occurs.

Figure 13:
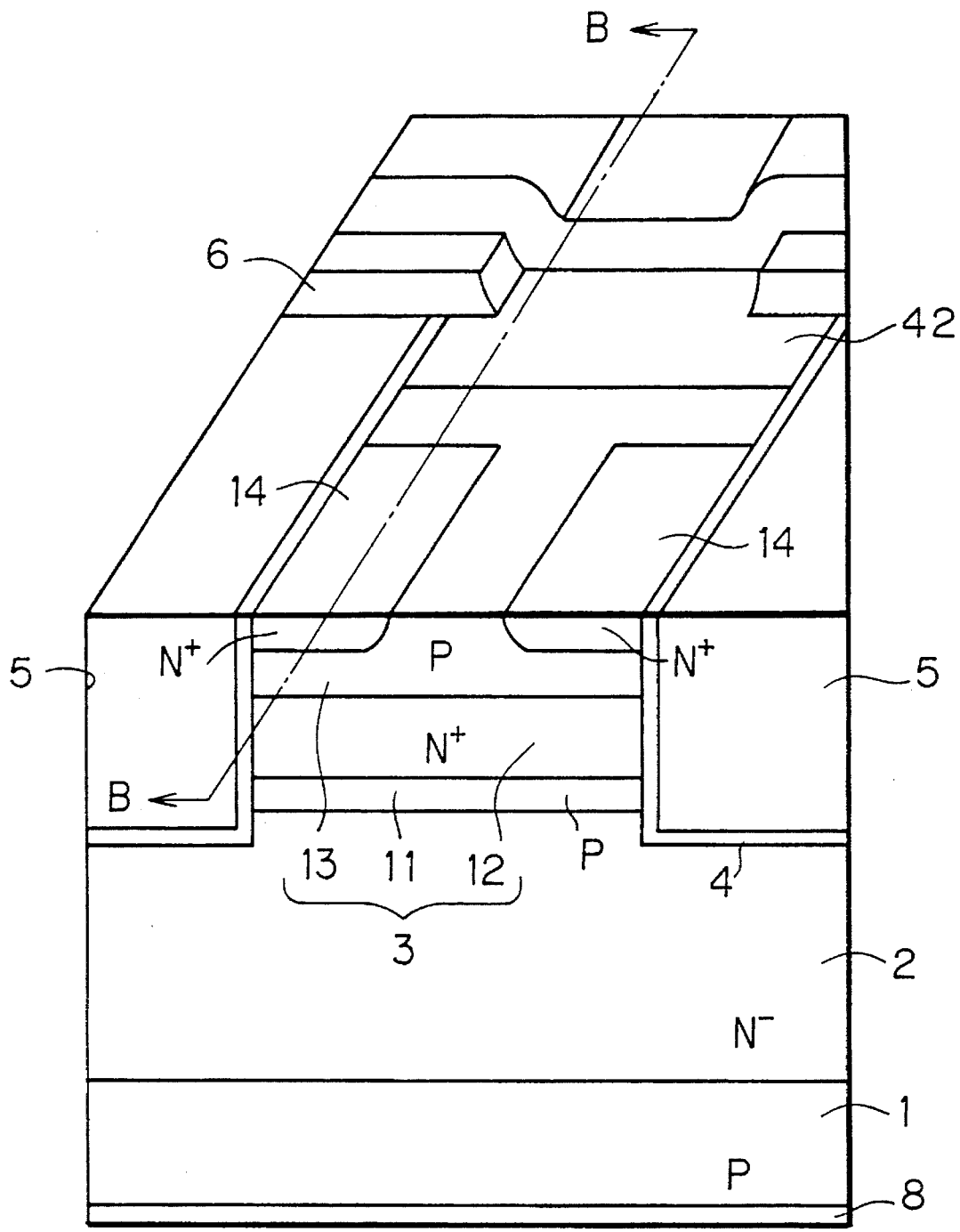
FIG. 13 is a perspective view showing a configuration of an EST of the second embodiment according to the present invention.
Figure 14:
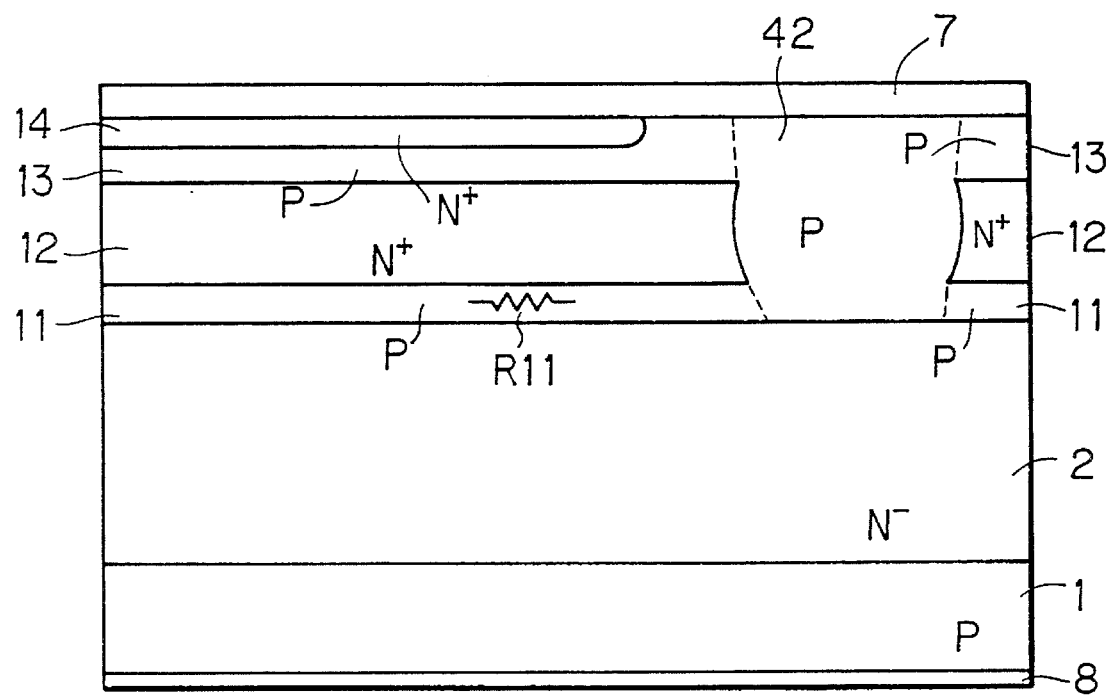
FIG. 14 is a sectional view along B—B of FIG. 13.

FIG. 13 is a perspective view showing a configuration of an EST of a second preferred embodiment according to the present invention, and FIG. 14 is a sectional view along B—B of FIG. 13. As shown in FIGS. 13 and 14, a P diffusion region 42 extending from the cathode electrode 7 to the $N^-$ epitaxial layer 2 is formed in a transistor forming region 3 as a substitute for the P diffusion region 15 in the first preferred embodiment. The P diffusion region 42 is formed contiguous to the P diffusion regions 11 and 13 and the $N^+$ diffusion region 12 but not to the $N^+$ diffusion region 14.

A PN junction between the $N^+$ diffusion region 12 and P diffusion region 11 is forwardly biased even by voltage drop when a resistance R11 in the P diffusion region 11 is sufficiently high in resistance value and a small amount of holes flow from the P diffusion region 11 to the P diffusion region 42, and electrons are introduced from the $N^+$ diffusion region 12 to the P diffusion region 11. As other components are similar to those of the first preferred embodiment, an explanation about them is omitted.

In the above-mentioned configuration, when a potential at the anode electrode 8 is raised setting the cathode electrode 7 and gate electrode 5 at the same potential, depletion layers expand from PN junctions between the P diffusion regions 11, 42 and the $N^-$ epitaxial layer 2 and hold voltage.

When voltage at the gate electrode 5 related to the cathode electrode 7 is raised, side regions of the P diffusion regions 11 and 13 which are opposed through the gate electrode 5 and insulating film 4 to each other are inverted. As a result, similar to the first preferred embodiment, electrons from the cathode electrode 7 flow into the $N^-$ epitaxial layer 2 while a junction between the $P^+$ substrate 1 and the $N^-$ epitaxial layer 2 is forwardly biased, and consequently, holes are introduced from the $P^+$ substrate 1 through the $N^-$ epitaxial layer 2 to the P diffusion regions 11 and 42.

As holes flowing into the P diffusion region 11 are introduced into the $N^+$ diffusion region 12, voltage drop due to the resistance R11 causes a PN junction between the $N^+$ diffusion region 12 and the P diffusion region 11 to be forwardly biased, and this, in turn, causes electrons to be introduced from the $N^+$ diffusion region 12 into the P diffusion region 11. When current between the anode electrode 8 and cathode electrode 7 increases, a thyristor consisting of the $N^+$ diffusion region 12, P diffusion region 11, $N^-$ epitaxial layer 2 and $P^+$ substrate 1 turns on to start an operation. As the following operation is similar to that of the first preferred embodiment, an explanation about it is omitted.

In order to reduce the hold current IK (see FIG. 12) which is a minimum current required for retaining a thyristor operation, the P diffusion region 11 may be elongated along B—B of FIG. 13 to increase the resistance R11. At this time, the $N^+$ diffusion region 14 may be elongated along B—B in comparison with a length of the P diffusion region 11, and hence, the NMOS transistor Q12 can be formed with a sufficiently long channel width, but an ON resistance during the thyristor operation never becomes higher as the resistance R11 becomes higher. Thus, making the resistance R11 higher, the hold current can be sufficiently reduced without a hindrance to other elements and a decrease of breakdown voltage caused by the P diffusion region 11 being into a floating state can be prevented. Also, similar to the first preferred embodiment, the EST is configured so as to avoid a latch-up phenomenon, and therefore, a maximum controllable current can be increased.

In a method of manufacturing the EST of the second preferred embodiment, compared to the process of manufacturing the first preferred embodiment, a P diffusion layer 31 which has no diffusion regions 11 to 14 thereupon partially remains together with the diffusion regions 12 to 14 between the grooves 41 when the grooves 41 are formed. As other process steps are similar to the process of manufacturing the first preferred embodiment, an explanation about them is omitted.

Figure 15:
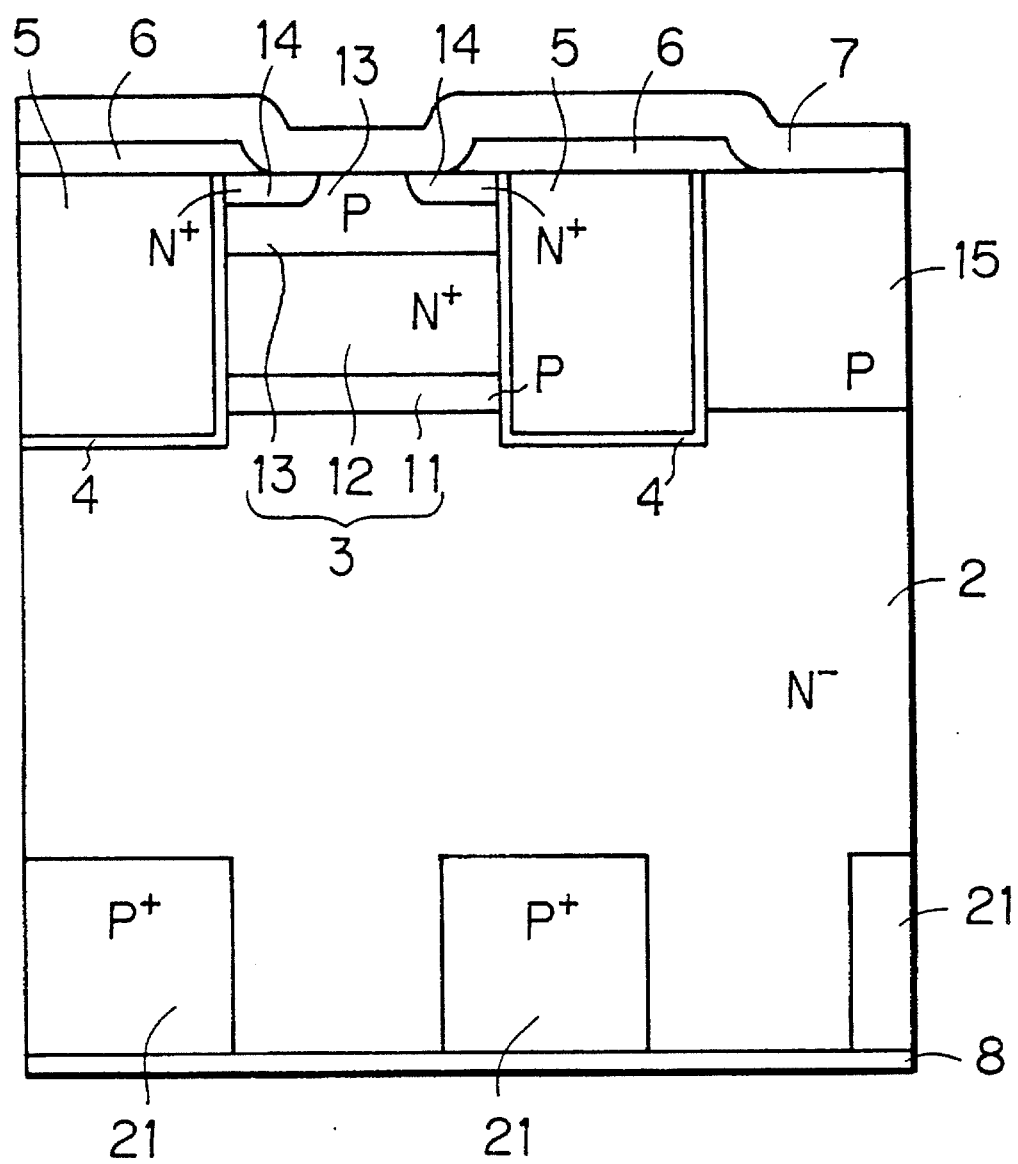
FIG. 15 is a sectional view showing a configuration of an EST of a third embodiment according to the present invention.

FIG. 15 is a sectional view showing a third embodiment according to the present invention. A cross section of FIG. 15 corresponds to a section along A—A of FIG. 1. As will be recognized, the $P^+$ substrate 1 of the first preferred embodiment is removed herein, and a $P^+$ diffusion region 21 is selectively formed on a second major surface of the $N^-$ epitaxial layer 2. As other components are similar to those of the first preferred embodiment, an explanation about them is omitted.

The operation of the EST of the third preferred embodiment will now be described.

First, when the cathode electrode 7 and gate electrode 5 are set at the same potential and a potential at the anode electrode 8 is raised, PN junctions between the P diffusion regions 11, 15 and the $N^-$ epitaxial layer 2 expand and hold voltage.

When voltage at the gate electrode 5 related to the cathode electrode 7 is raised in this state, side regions of the P diffusion regions 11 and 13 which are opposed through the gate electrode 4 and insulating film 4 to each other are negatively inverted. As a result, similar to the first preferred embodiment, electrons from the cathode electrode 7 flow through the epitaxial layer 2 into the anode electrode 8. At this time, when a density of electron current becomes large to some extent, voltage drop caused by electrons flowing in the $N^-$ epitaxial layer 2 between the $P^+$ diffusion regions 21 causes a PN junction between the $P^+$ diffusion region 21 and the $N^-$ epitaxial layer 2 to be forwardly biased, and this, in turn, causes holes to be introduced from the $P^+$ diffusion regions 21 to the $N^-$ epitaxial layer 2.

As a result, holes are introduced through the $N^-$ epitaxial layer 2 to the P diffusion regions 11 and 15. As the holes led into the P diffusion region 11 are introduced into the $N^+$ diffusion region 12, electrons are introduced from the $N^+$ diffusion region 12 into the P diffusion region 11, similar to the first preferred embodiment. Then, when current between the anode electrode 8 and cathode electrode 7 is increased, a thyristor consisting of the $N^+$ diffusion region 12, P diffusion region 11, $N^-$ epitaxial layer 2 and $P^+$ diffusion region 21 turns on to start an operation. As other operation is similar to that of the first preferred embodiment, an explanation is omitted.

In a configuration as mentioned above, since the anode electrode 8 and the $N^-$ epitaxial layer 2 are contiguous to each other, an introduction of holes from the anode electrode 8 stops when an amount of the voltage drop caused by the electrons flowing in the $N^-$ epitaxial layer 2 between the $P^+$ diffusion regions 21 becomes lower than a level of a forward bias at the PN junction between the $P^+$ diffusion regions 21 and the $N^-$ epitaxial layer 2. Thus, an introduction of hole current from the $P^+$ diffusion regions 21 into the $N^-$ epitaxial layer 2 is reduced earlier than an introduction of hole current from the $P^+$ substrate 1 to the $N^-$ epitaxial layer 2 in the first preferred embodiment, and a turn-off period can be improved more than the first embodiment.

In the EST of the third preferred embodiment thus configured, hold current is slightly increased in accordance with an improvement of the turn-off period, and, similar to the first preferred embodiment, a maximum controllable current can be increased and the hold current can be decreased.

In the method of manufacturing the EST of the third preferred embodiment, compared to the process of manufacturing the first preferred embodiment shown in FIGS. 5 to 11, a step of selectively forming $P^+$ diffusion regions 21 on a reverse surface of an $N^-$ epitaxial layer 2 (of an $N^-$ layer corresponding to the same) is added to alternatively provide an anode electrode 8 on the reverse surface of the $N^-$ epitaxial layer 2 including the $P^+$ diffusion regions 21. As other steps are similar to those of the process of manufacturing the first preferred embodiment, an explanation about them is omitted.

Figure 16:
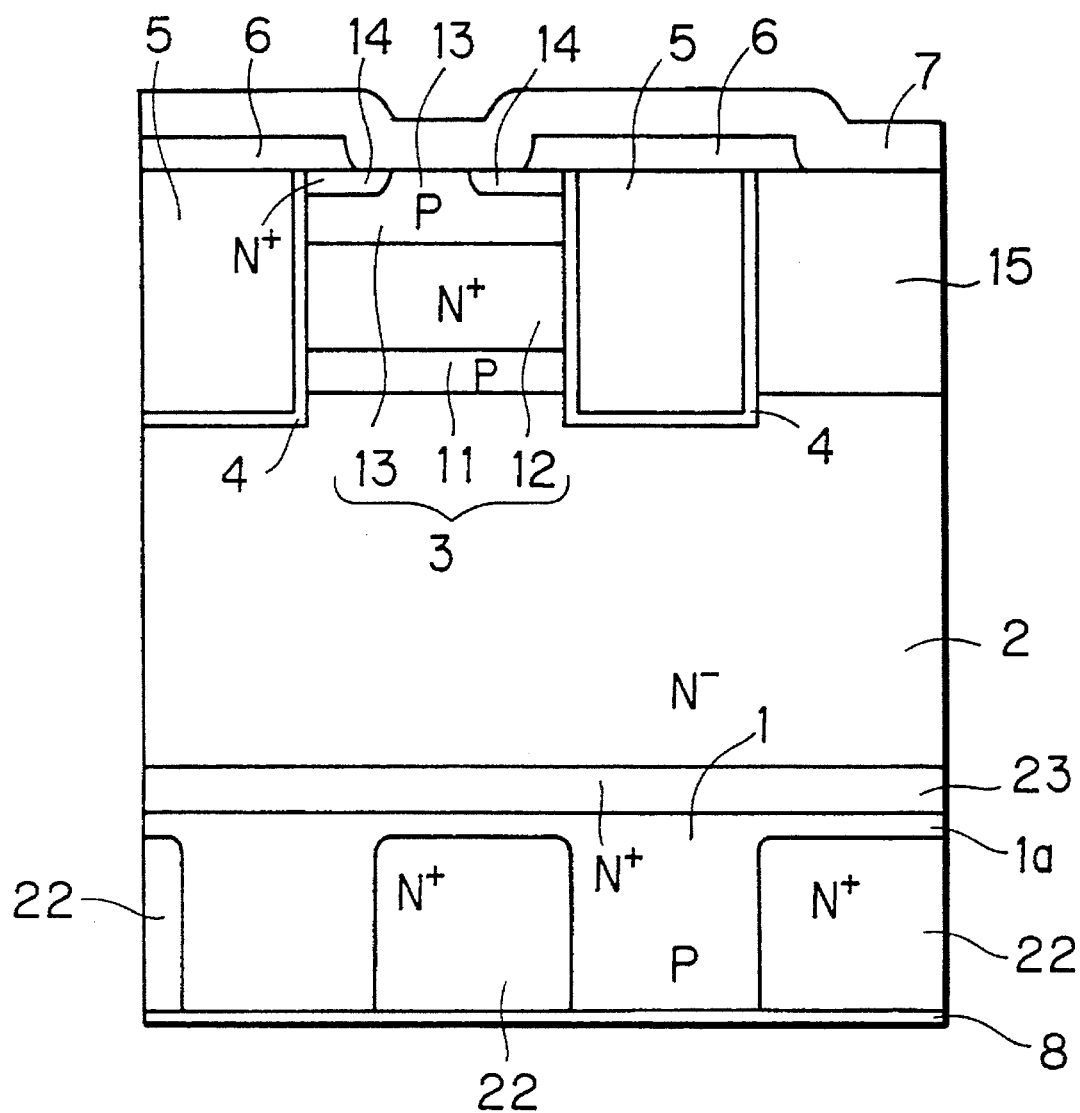
FIG. 16 is a sectional view showing a configuration of an EST of a fourth embodiment according to the present invention.

FIG. 16 is a sectional view showing a configuration of a fourth embodiment according to the present invention. A cross-section shown in FIG. 16 corresponds to a section along A—A of the first preferred embodiment. As will be recognized, $N^+$ diffusion regions 22 are selectively formed on a first major surface of a $P^+$ substrate 1. Then, an anode electrode 8 is formed on a second major surface of the $P^+$ substrate 1 including the $N^+$ diffusion regions 22. An $N^+$ buffer layer 23 is formed on the first major surface of the $P^+$ substrate 1 while an $N^-$ epitaxial layer 2 is formed on the $N^+$ buffer layer 23. As other components are similar to those of the first preferred embodiment, an explanation about them is omitted. An operation of an EST of the fourth preferred embodiment is almost the same as the operation of the first preferred embodiment, and therefore, an description of it is omitted.

A characteristic of the EST of the fourth preferred embodiment will now be described using a comparison with a case where an $N^+$ buffer layer 23 is interposed between the $P^+$ substrate 1 and the $N^-$ epitaxial layer 2 in the EST of the first preferred embodiment.

It is generally known that providing the $N^+$ buffer layer 23 in the EST of the first preferred embodiment, punch-through in an OFF state can be prevented and an introduction of holes can be controlled in an ON state even if the $N^-$ epitaxial layer 2 is made thinner. At this time, although an ON resistance becomes lower as the $N^+$ buffer layer 23 is made thinner and an impurity concentration is made lower, a device may be easily broken down because current flows excessively when extremely high voltage is applied between the electrodes 7 and 8. On the contrary, making the $N^+$ buffer layer 23 thicker and the impurity concentration higher, current does not flow excessively even if extremely high voltage is applied between the electrodes 7 and 8, a device is not easily broken down, but an ON resistance rises. In fact, an enhancement of the durability of an element because of a formation of the $N^+$ buffer layer 23 and a reduction of an ON resistance is in relation of trade-off, and hence, when the $N^+$ buffer layer 23 is provided in the first preferred embodiment, an effect as mentioned above can be obtained but an adjustment to a film thickness and an impurity concentration is difficult. This can be applied to a case of the second and third preferred embodiments.

On the other hand, in the EST of the fourth preferred embodiment, when a density of electron current introduced into the $P^+$ substrate 1 reaches a predetermined level or over because of an existence of the $N^+$ diffusion regions 22, a region 1a in the $P^+$ substrate 1 between the $N^-$ epitaxial layer 2 and the $N^+$ diffusion regions 22 is depleted because of voltage drop caused by hole current flowing therein. As a result, electron current flows from the $N^-$ epitaxial layer 2 directly into the $N^+$ diffusion regions 22, holes are no longer introduced from the region 1a in the $P^+$ substrate 1 which has become a depletion region, and consequently, an amount of introduced holes from the $P^+$ substrate 1 is suppressed. Hereinafter, this effect is referred to as "depleted current suppression effect". Thus, designing a thickness of the region 1a in the $P^+$ substrate 1, an allocation of $N^+$ diffusion regions, a film thickness of the $N^+$ buffer layer 23, an impurity concentration and the like so that the depleted current suppression effect works when conducting current between the electrodes 7 and 8 reaches rate current or over, the depleted current suppression effect works in the case of over-rated current even if excessively high voltage is applied between the electrodes 7 and 8 when an ON resistance is lowered by making the $N^+$ buffer layer 23 thinner and an impurity concentration lower, and therefore, a device cannot be easily broken down because current no longer flow excessively. As a result, a trade-off relation between an enhancement of the durability of the device because of the formation of the $N^+$ buffer layer 23 and a reduction of the ON resistance is improved, and consequently, an adjustment between a film thickness of the $N^+$ buffer layer 23 and an impurity concentration in the fourth preferred embodiment is relatively easy, and thus, a full effect of forming the $N^+$ buffer layer 23 can be attained with a configuration of the fourth preferred embodiment.

Figure 17:
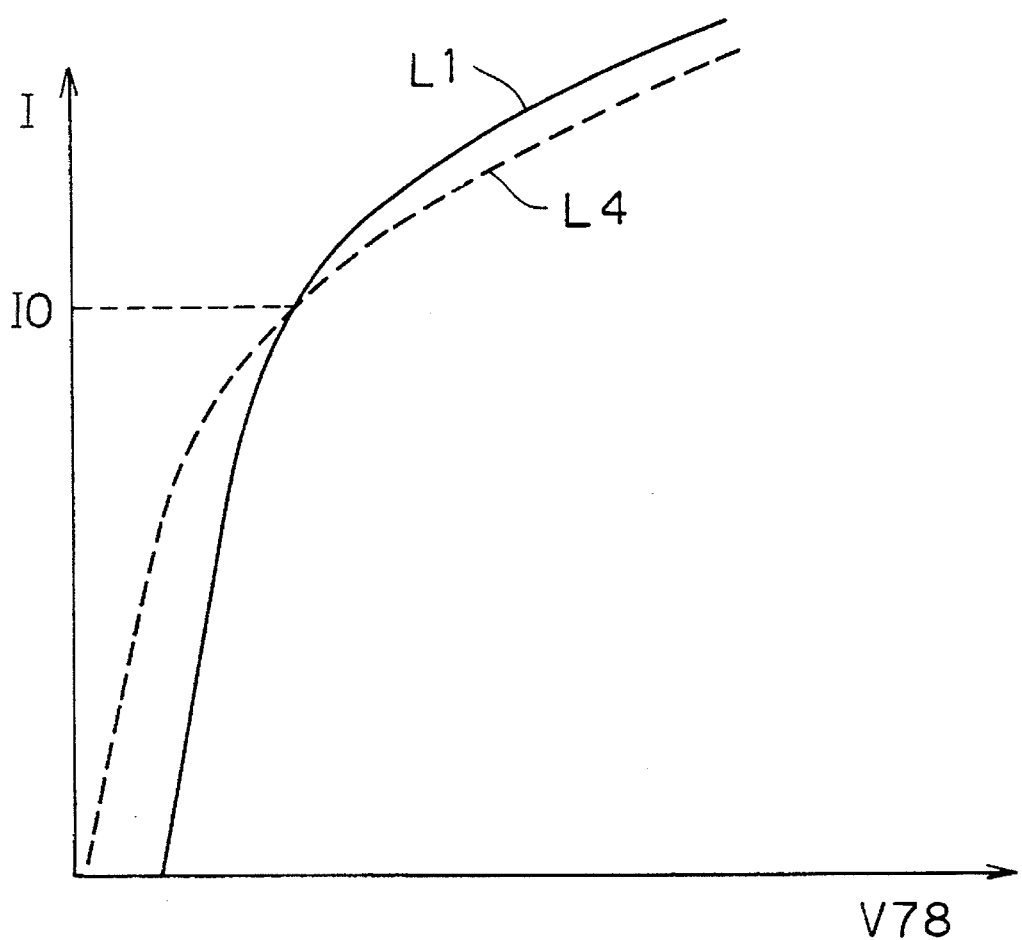
FIG. 17 is a graph for explaining an effect of the EST of the fourth embodiment.
Figure 18:
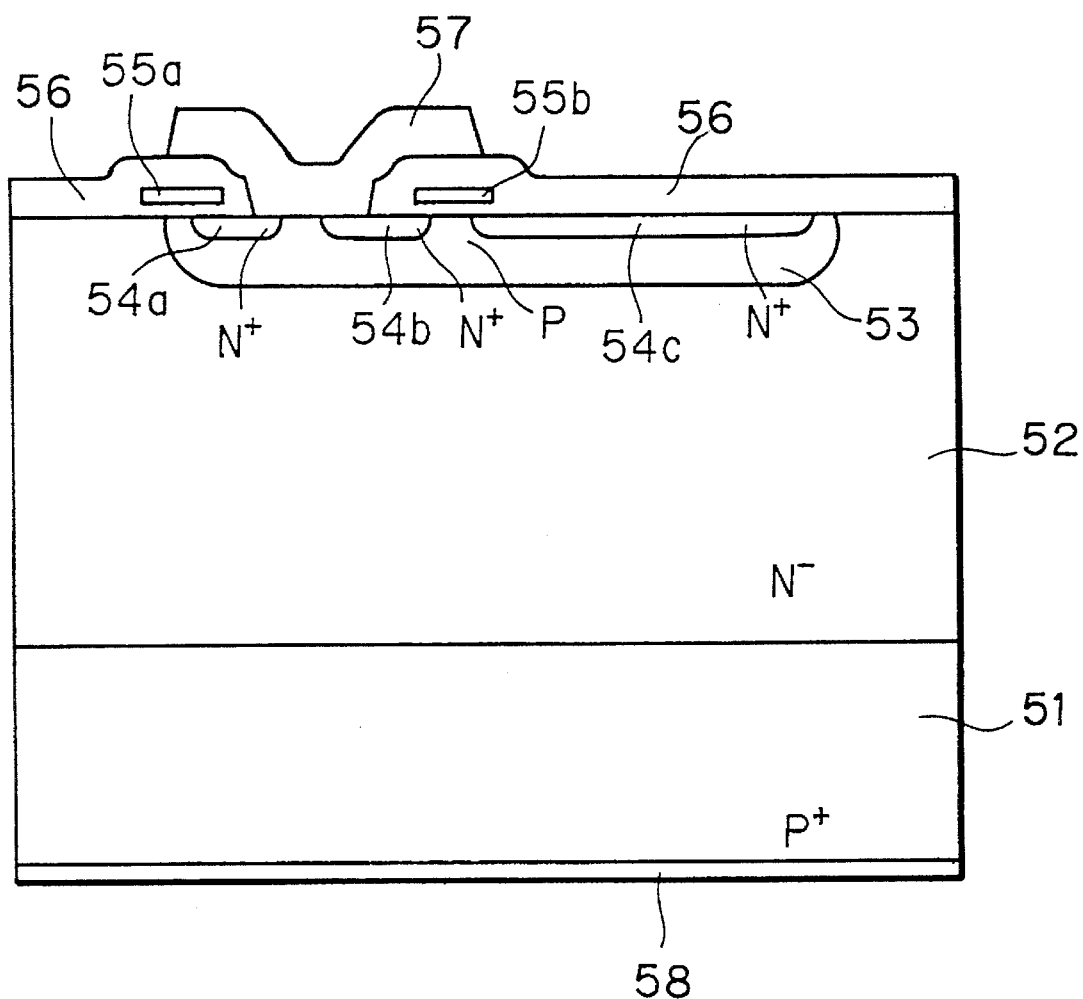
FIG. 18 is a sectional view showing a configuration of a conventional EST.
Figure 19:
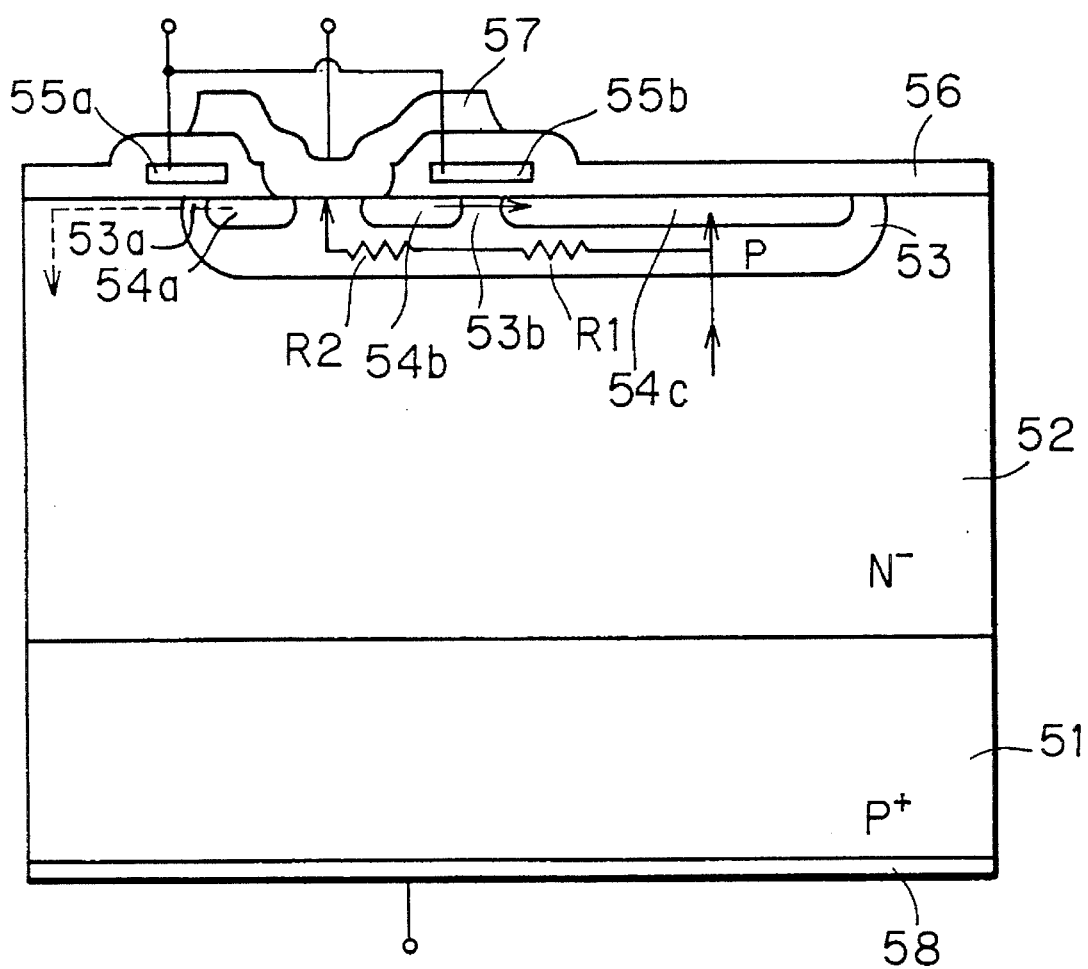
FIG. 19 is a model sectional view for explaining the operation of the conventional EST.
Figure 20:
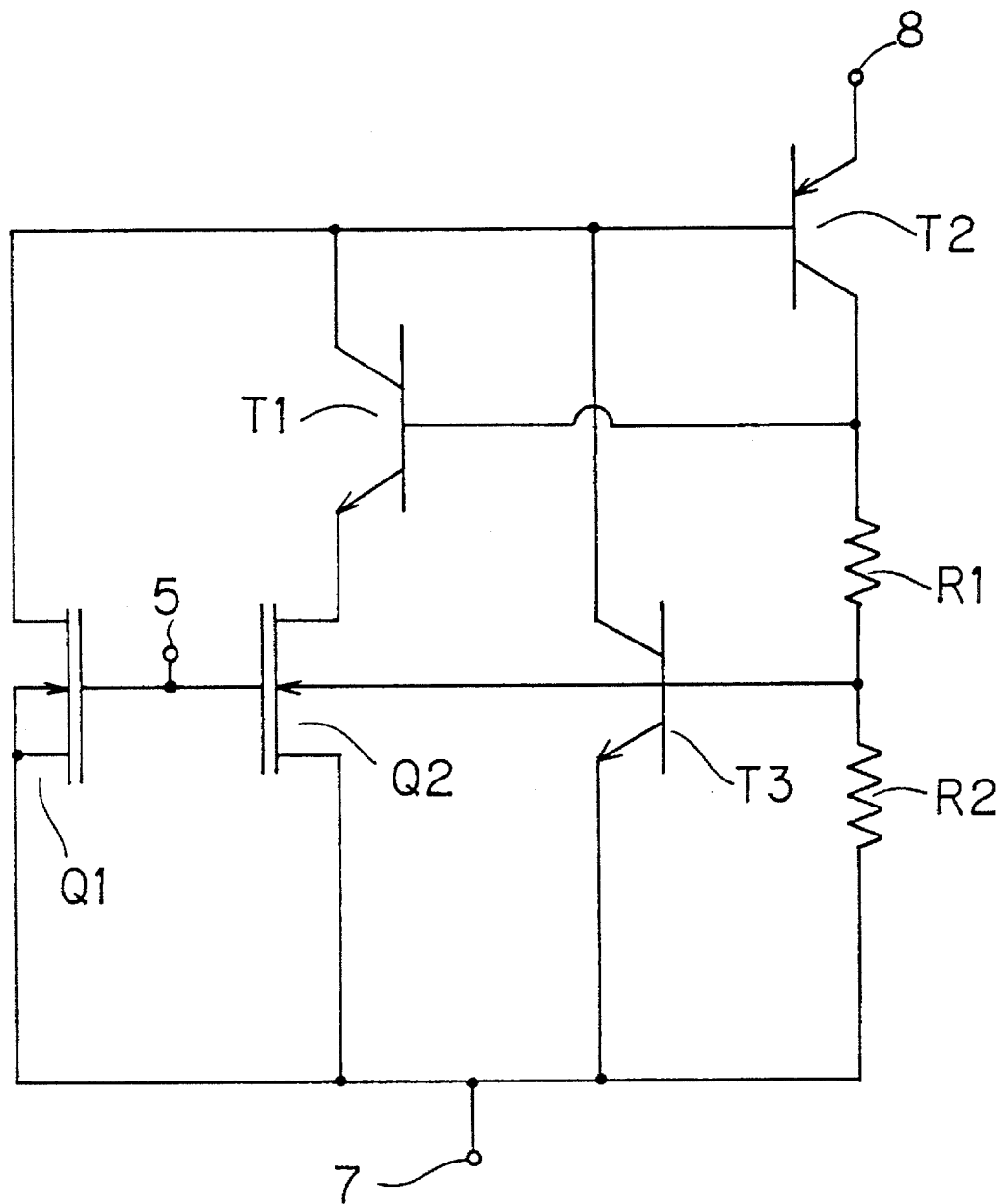
FIG. 20 is an equivalent circuit diagram of the conventional EST.
Figure 21:
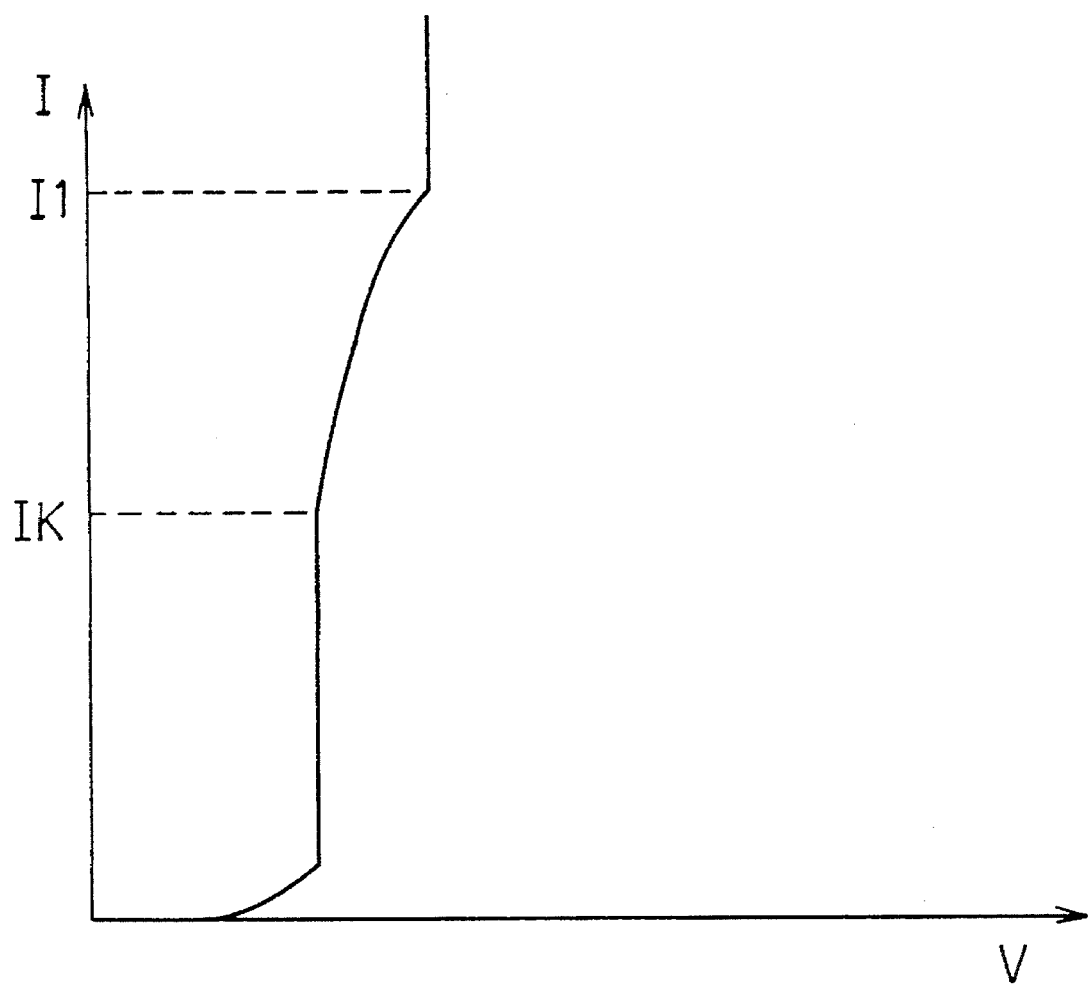
FIG. 21 is a graph showing a relation between control voltage and conducting current of the conventional EST.

FIG. 17 is a graph showing relations between voltage V78 between the electrodes 7 and 8 and conducting current I between the electrodes 7 and 8 (logarithmic expression) in the EST of the first preferred embodiment where the $N^+$ buffer layer 23 is provided and the EST of the fourth preferred embodiment. Referring to FIG. 17, I0 designates rated current, L1 designates a characteristic of the EST of the first preferred embodiment, and L4 designates a characteristic of the EST of the fourth preferred embodiment. As can be seen, the EST of the fourth preferred embodiment has a good characteristic that a ON resistance below the rated current I0 is low while it is high over the rated current I0.

In the EST of the fourth preferred embodiment having the above-mentioned relation, similar to the first preferred embodiment, a maximum controllable current can be increased and hold current can be decreased, and additionally, a durability of a device can be enhanced with a low ON resistance.

In the method of manufacturing the EST of the fourth preferred embodiment, compared to the process of manufacturing the first preferred embodiment shown in FIGS. 5 to 11, a step of forming the $N^+$ buffer layer 23 on a first major surface of the P substrate 1 and a step of forming the N⁺ diffusion regions 22 on a second major surface of the P⁺ substrate are added, so that, alternatively, the N⁻ epitaxial layer 2 is formed on the N⁺ buffer layer 23 and the anode electrode 8 is formed on a second major surface of the P⁺ substrate 1 including the N⁺ diffusion regions 22. As other steps are similar to those of the process of manufacturing the first preferred embodiment, an explanation about them is omitted.

As has been described, according to the present invention, a semiconductor device or a device manufactured in a method has a configuration of a thyristor consisting of a semiconductor substrate, a first semiconductor layer, and first and second semiconductor regions, and the thyristor is set to an ON state by setting first and second control electrodes to a predetermined potential level and inverting a conductivity of side surfaces of first and third semiconductor regions under first and second insulating films into a second conductivity type.

Even if the thyristor turns on, carriers no longer reach the third semiconductor region of the first conductivity type because carriers introduced from the first semiconductor region to the second semiconductor region recombine in the second semiconductor region. Thus, a potential difference at a level where a region between the third and fourth semiconductor regions is forwardly biased never occurs because of carriers flowing in the third semiconductor region of the first conductivity type, and therefore, a parasitic transistor consisting of the second, third and fourth semiconductor regions is never activated. As a result, even with an increase of conducting current between the first and second main electrodes, a latch-up state is not caused, that is, there is an effect that a maximum controllable current can be increased.

A side surface of the first semiconductor region is inverted, so that a current amplification factor of a transistor consisting of the first semiconductor layer and first and second semiconductor regions is enhanced, and since the first semiconductor region is in an electrically floating state, there is an effect that can retain a thyristor operation can be obtained at a lower hold current.

In other words, without degrading a characteristic, a maximum controllable current can be increased and hold current can be decreased.

While the invention has been shown and described in detail, the foregoing description is in all aspects illustrative and not restrictive. It is therefore understood that numerous modifications and variations can be devised without departing from the scope of the invention.

I claim:

1. A semiconductor device comprising
   a semiconductor substrate of a first conductivity type having first and second major surfaces;
   a first semiconductor layer of a second conductivity type formed on said first major surface of said first semiconductor substrate;
   a first semiconductor region of the first conductivity type selectively formed on said first semiconductor layer;
   a second semiconductor region of the second conductivity type formed on said first semiconductor region;
   a third semiconductor region of the first conductivity type formed on said second semiconductor region;
   a fourth semiconductor region selectively formed in a surface of said third semiconductor region;
   a first insulating film formed on side surfaces of said first and third semiconductor regions;
   a first control electrode formed on said first insulating film;
   a first main electrode formed on said third and fourth semiconductor regions independent of said first control electrode;
   a second main electrode formed on said second major surface of said semiconductor substrate; and
   a fifth semiconductor region of the first conductivity type formed on said first semiconductor layer directly connecting said first and third semiconductor regions.

2. A device according to claim 1, wherein said fifth semiconductor region is formed independent of said first control electrode; said first main electrode being also formed on said fifth semiconductor region.

3. A device according to claim 1, wherein said first conductivity type is a P type while said second conductivity type is an N type.

4. A device according to claim 1, wherein said first semiconductor region is elongated in a width direction of said device.

5. A device according to claim 4, wherein said fourth semiconductor region is elongated in a width direction of said device.

6. A device according to claim 1, comprising a second insulating film formed on second side surfaces, opposing said first side surfaces, of said first and third semiconductor regions and a second control electrode formed on said second insulating film.

7. A device according to claim 6, wherein said fifth semiconductor region is formed independent of said first and second control electrodes.

8. A semiconductor device comprising
   a first semiconductor layer of a second conductivity type having first and second major surfaces;
   a first semiconductor region of a first conductivity type selectively formed on said first major surface of said first semiconductor layer;
   a second semiconductor region of the second conductivity type formed on said first semiconductor region;
   a third semiconductor region of the first conductivity type formed on said second semiconductor region;
   a fourth semiconductor region of the second conductivity type selectively formed in a surface of said third semiconductor region;
   a fifth semiconductor region of the first conductivity type selectively formed in said second major surface of said first semiconductor layer;
   a sixth semiconductor region of the first conductivity type formed on said first semiconductor layer directly connecting said first and third semiconductor regions;
   a first insulating film formed on side surfaces of said first and third semiconductor regions;
   a first control electrode formed on said first insulating film;
   a first main electrode formed on said third and fourth semiconductor regions independent of said first control electrode; and
   a second main electrode formed on said second major surface of said first semiconductor layer including said fifth semiconductor region.

9. A device according to claim 8, comprising a second insulating film formed on second side surfaces, opposing said first side surfaces, of said first and third semiconductor regions and a second control electrode formed on said second insulating film.

10. A device according to claim 8, wherein said first semiconductor region is elongated in a width direction of said device.

11. A device according to claim 10, wherein said fourth semiconductor region is elongated in a width direction of said device.

12. A semiconductor device comprising
- a semiconductor substrate of a first conductivity type having first and second major surfaces;
- a semiconductor buffer layer of a second conductivity type formed on said first major surface of said semiconductor substrate;
- a first semiconductor layer of the second conductivity type formed on said semiconductor buffer layer, said first semiconductor layer being lower in impurity concentration than said semiconductor buffer layer;
- a first semiconductor region of the first conductivity type selectively formed on said first semiconductor layer;
- a second semiconductor region of the second conductivity type formed on said first semiconductor region;
- a third semiconductor region of the first conductivity type formed on said second semiconductor region;
- a fourth semiconductor region of the second conductivity type selectively formed in a surface of said third semiconductor region;
- a fifth semiconductor region of the second conductivity type selectively formed in said second major surface of said semiconductor substrate;
- a sixth semiconductor region of the first conductivity type formed on said first semiconductor layer to directly connect said first and third semiconductor regions;
- a first insulating film formed on side surfaces of said first and third semiconductor regions;
- a first control electrode formed on said first insulating film;
- a first main electrode formed on said third and fourth semiconductor regions independent of said first control electrode; and
- a second main electrode formed on said second major surface of said semiconductor substrate including said fifth semiconductor region.

13. A device according to claim 12, comprising a second insulating film formed on second side surfaces, opposing said first side surfaces, of said first and third semiconductor regions and a second control electrode formed on said second insulating film.

14. A device according to claim 12, wherein said first semiconductor-region is elongated in a width direction of said device.

15. A device according to claim 14, wherein said fourth semiconductor region is elongated in a width direction of said device.

* * * * *